United States Patent [19]

Dyer et al.

[11] 4,361,877
[45] Nov. 30, 1982

[54] BILLING RECORDER WITH NON-VOLATILE SOLID STATE MEMORY

[75] Inventors: Robert E. Dyer; Murray C. Carney, both of Dunwoody, Ga.

[73] Assignee: Sangamo Weston, Inc., Atlanta, Ga.

[21] Appl. No.: 118,829

[22] Filed: Feb. 5, 1980

[51] Int. Cl.³ .......................................... G06F 15/21
[52] U.S. Cl. .................................................... 364/900
[58] Field of Search ............... 364/900 MS File, 401, 364/464, 481, 483, 200 MS File; 360/4, 61; 346/14 MR; 324/113; 369/48

[56] References Cited

U.S. PATENT DOCUMENTS

| | | | |
|---|---|---|---|
| 3,344,408 | 9/1967 | Singer et al. | 364/900 |
| 3,820,075 | 6/1974 | Ebner | 364/200 |
| 3,956,740 | 5/1976 | Jones et al. | 360/4 X |
| 4,050,020 | 9/1977 | Germer et al. | 364/483 X |
| 4,093,997 | 6/1978 | Germer | 364/900 |
| 4,125,871 | 11/1978 | Martin | 364/900 |
| 4,197,582 | 4/1980 | Johnston et al. | 364/483 |
| 4,199,717 | 4/1980 | Germer et al. | 364/483 X |
| 4,253,151 | 2/1981 | Bouve | 364/483 |

*Primary Examiner*—Gareth D. Shaw
*Assistant Examiner*—Thomas M. Heckler
*Attorney, Agent, or Firm*—Emrich, Lee, Brown & Hill

[57] ABSTRACT

A billing recorder for providing a record of customer usage of electricity has a controller which may include a microprocessor for receiving and processing pulses from an electric meter. Data from one or more input channels is temporarily stored in random access memory by the controller in data words representative of energy consumed in predetermined time ("demand") intervals. The accumulated measurement ("event") data and time reference data are transferred to a non-volatile, solid state memory at the end of relatively long collection periods which comprise a number of demand intervals. The solid state preferably is energized by the controller only during data transfers. The entire memory module is removable for processing at a central location, and it is replaced with a new one when it is removed. During memory replacement, which may occur at most times with minor exception, the processor prepares a special Removal Record and transfers that record to predetermined locations on the memory module being removed. The processor also prepares a special Insertion Record for the new module. The cumulative counts recorded on these special records as well as the normal records establish reliable data continuity. A field test enables testing of the meter, data inputs and processing circuitry in the field. Further, the identification data (I.D.) may be set on the recorder in the field after installation or replacement. Provisions are made for incorporating various options such as Daylight Savings Time, one or two input channels and operation on 50 or 60 Hz. line frequency.

53 Claims, 12 Drawing Figures

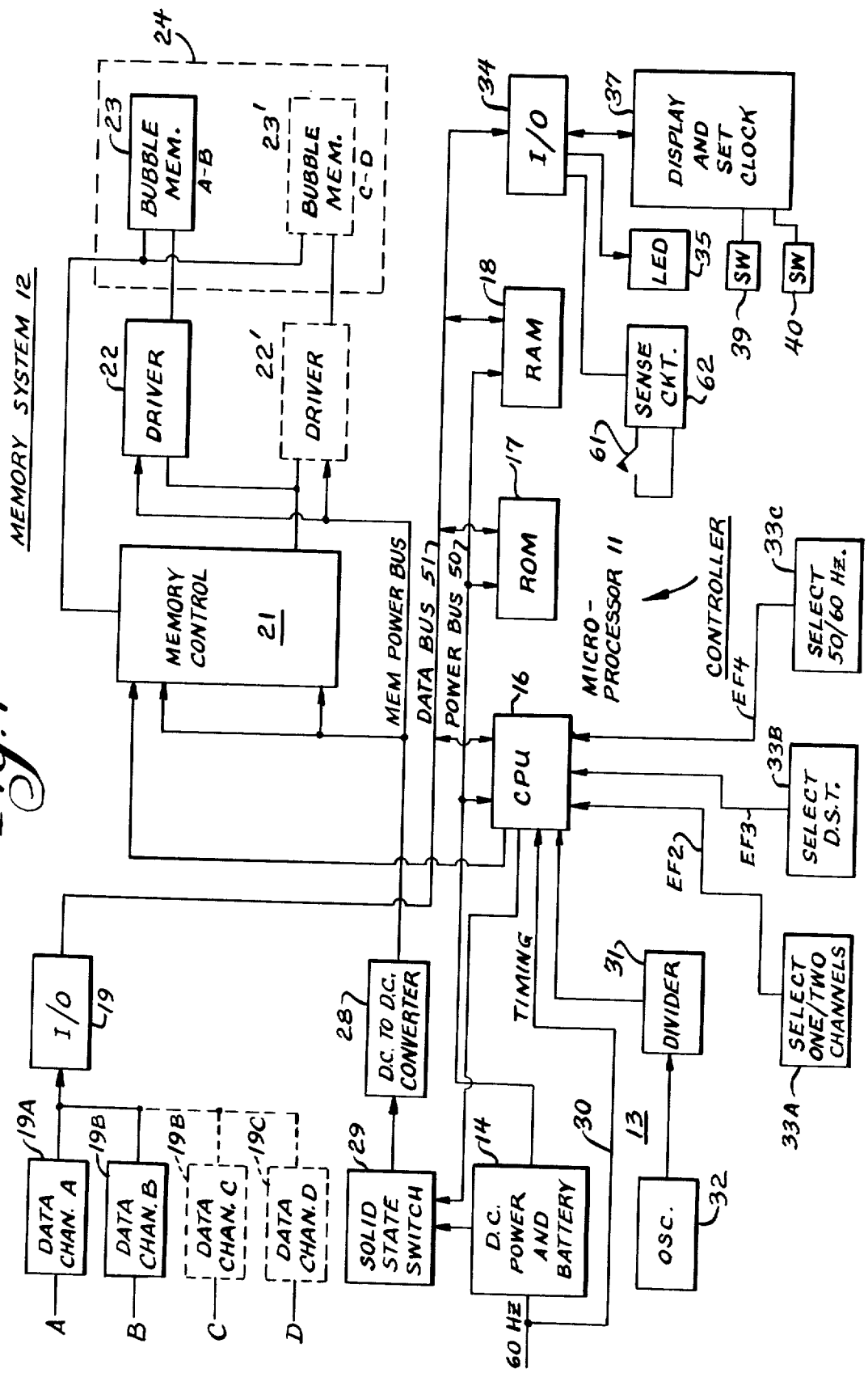

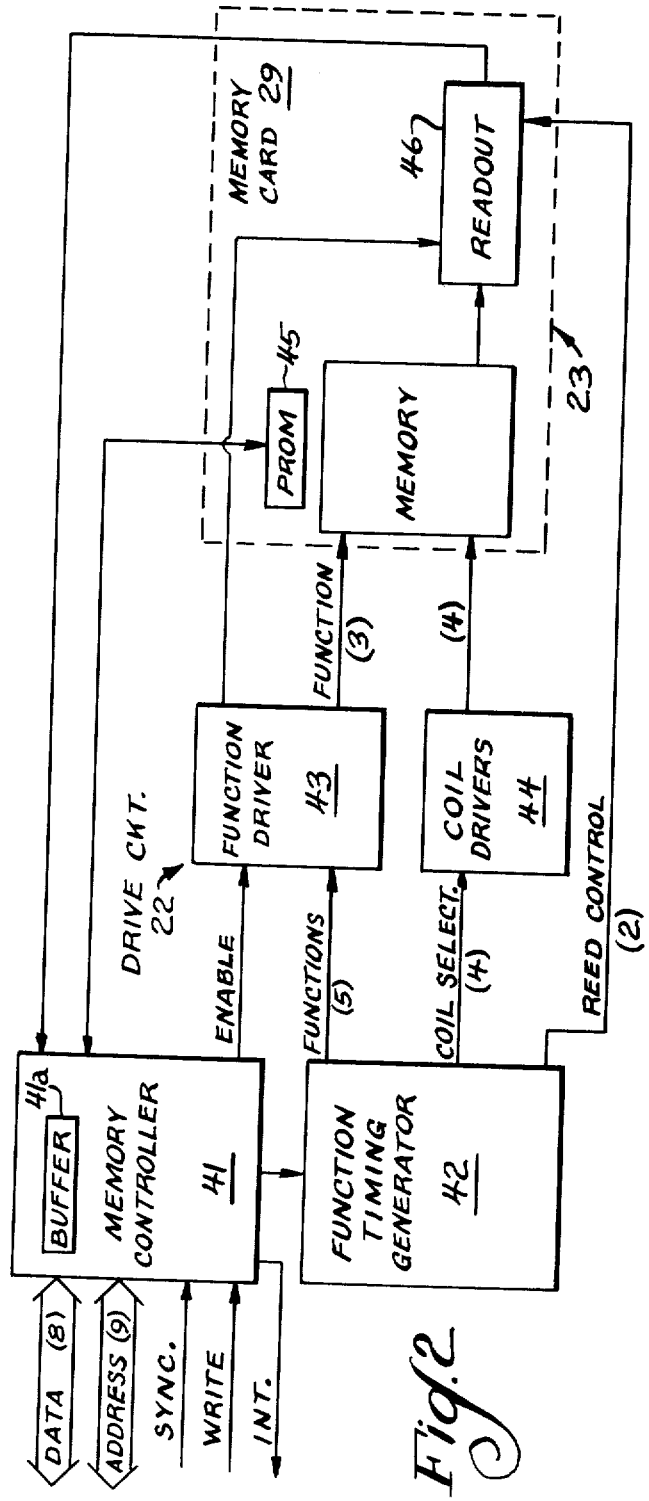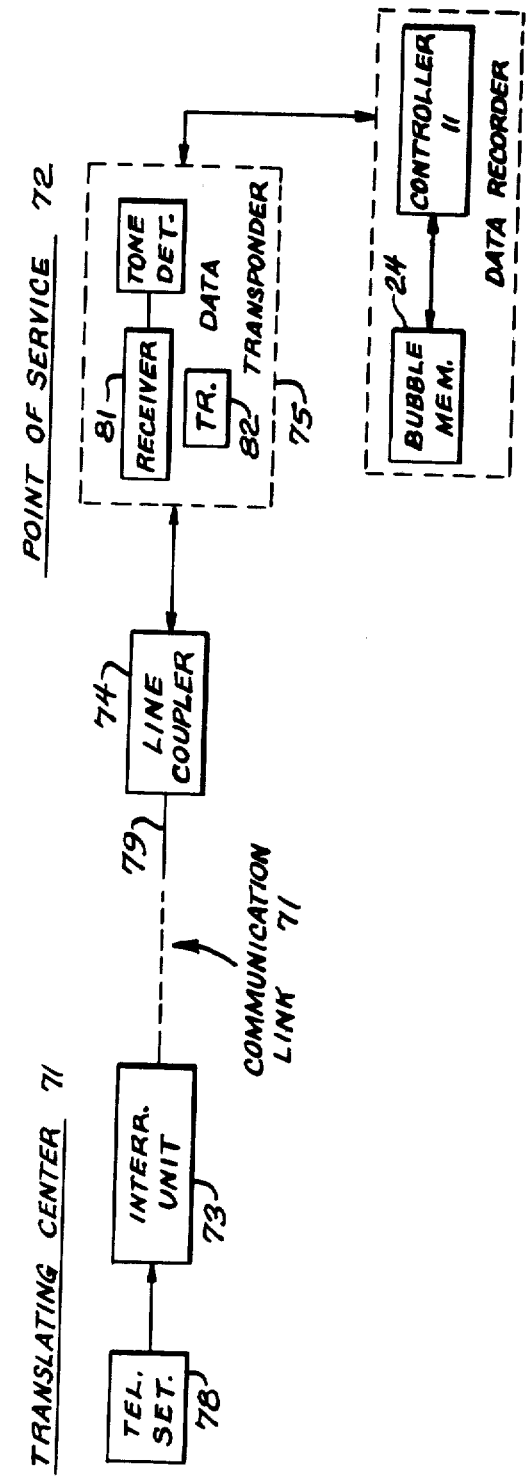

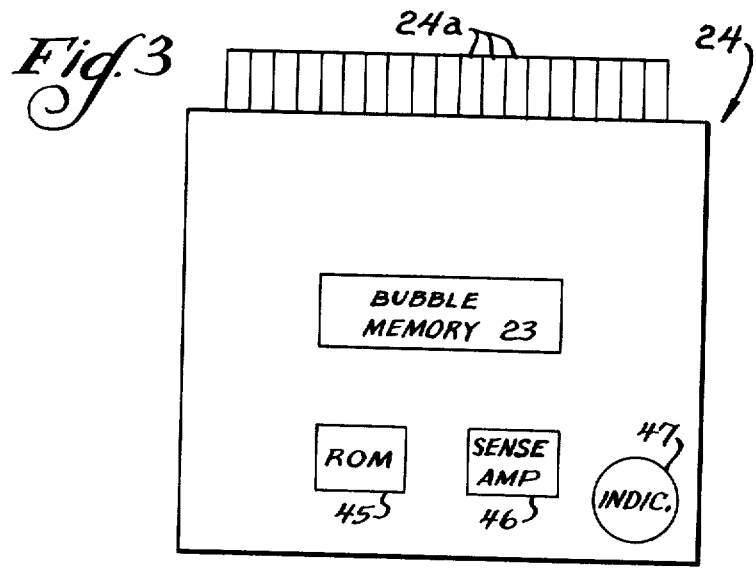
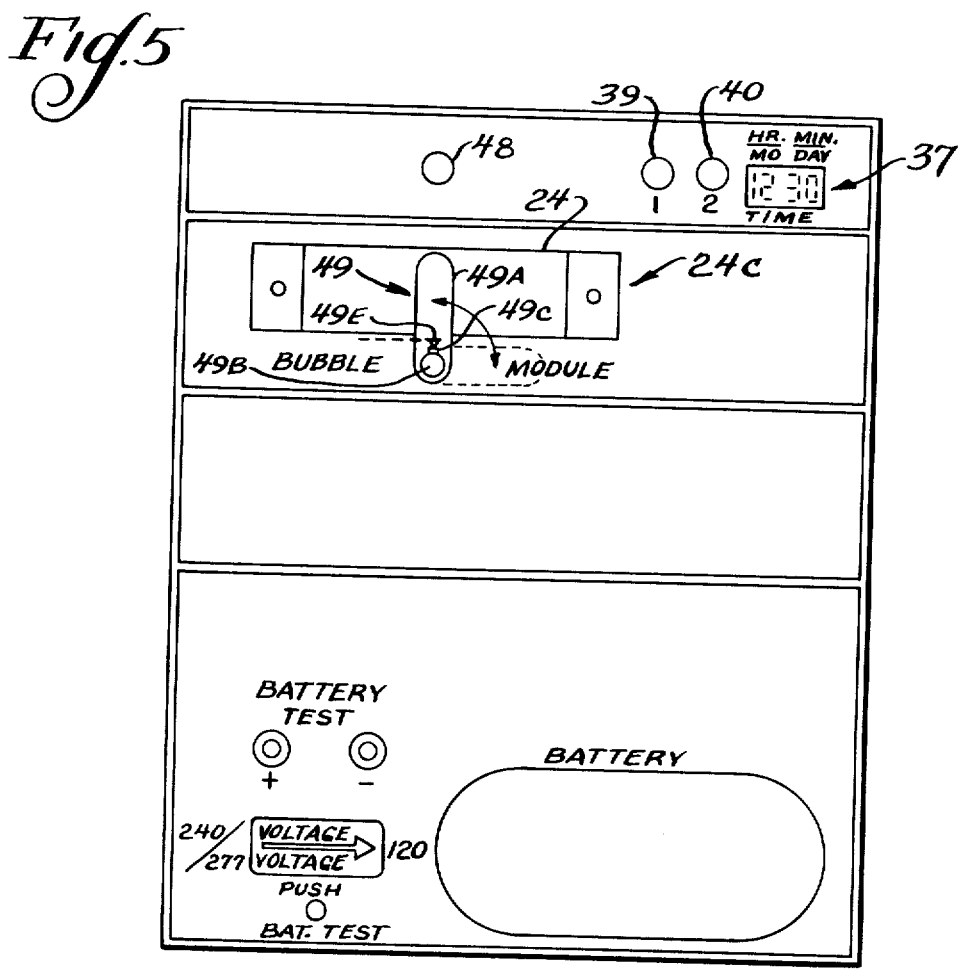

CHART I

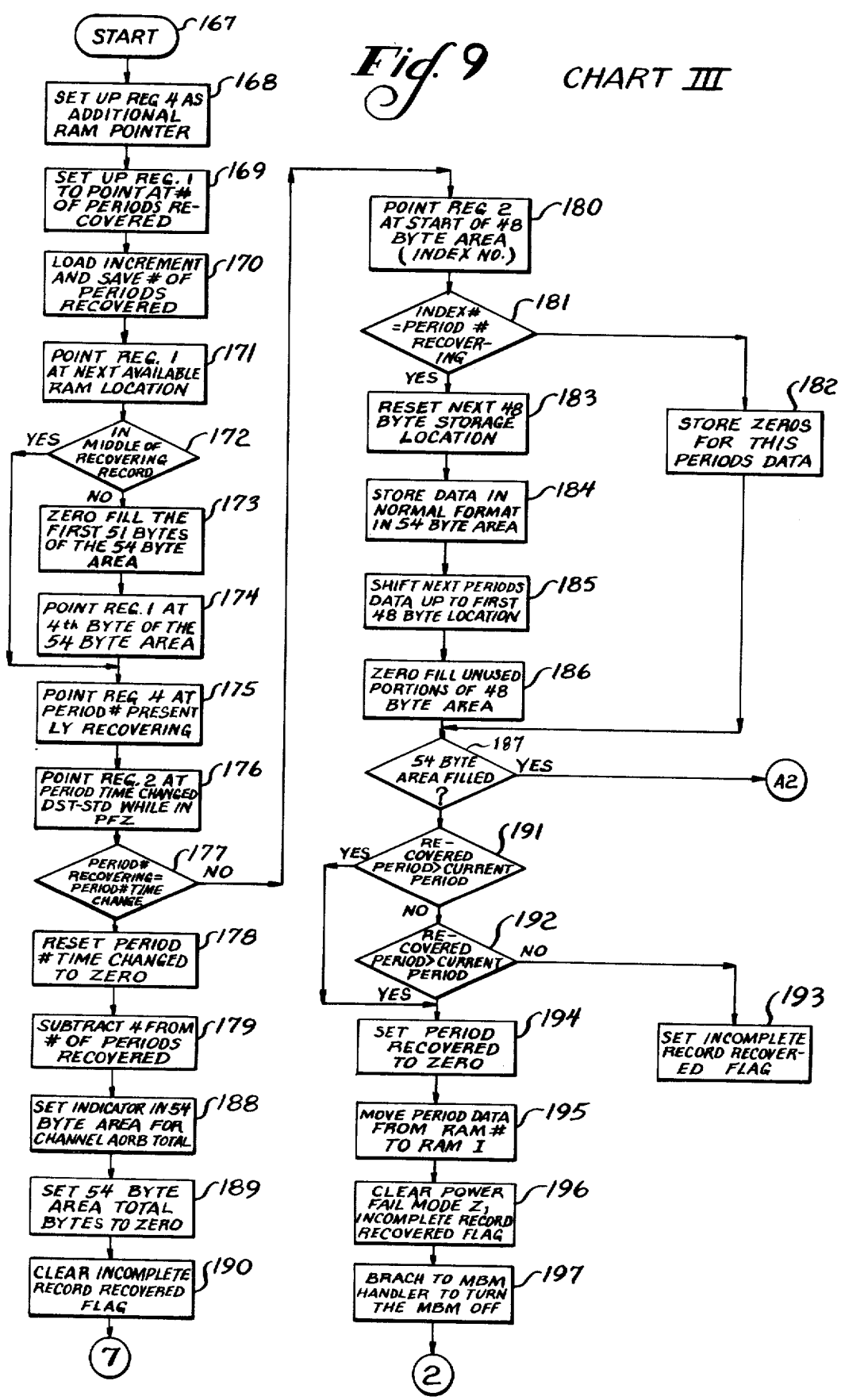

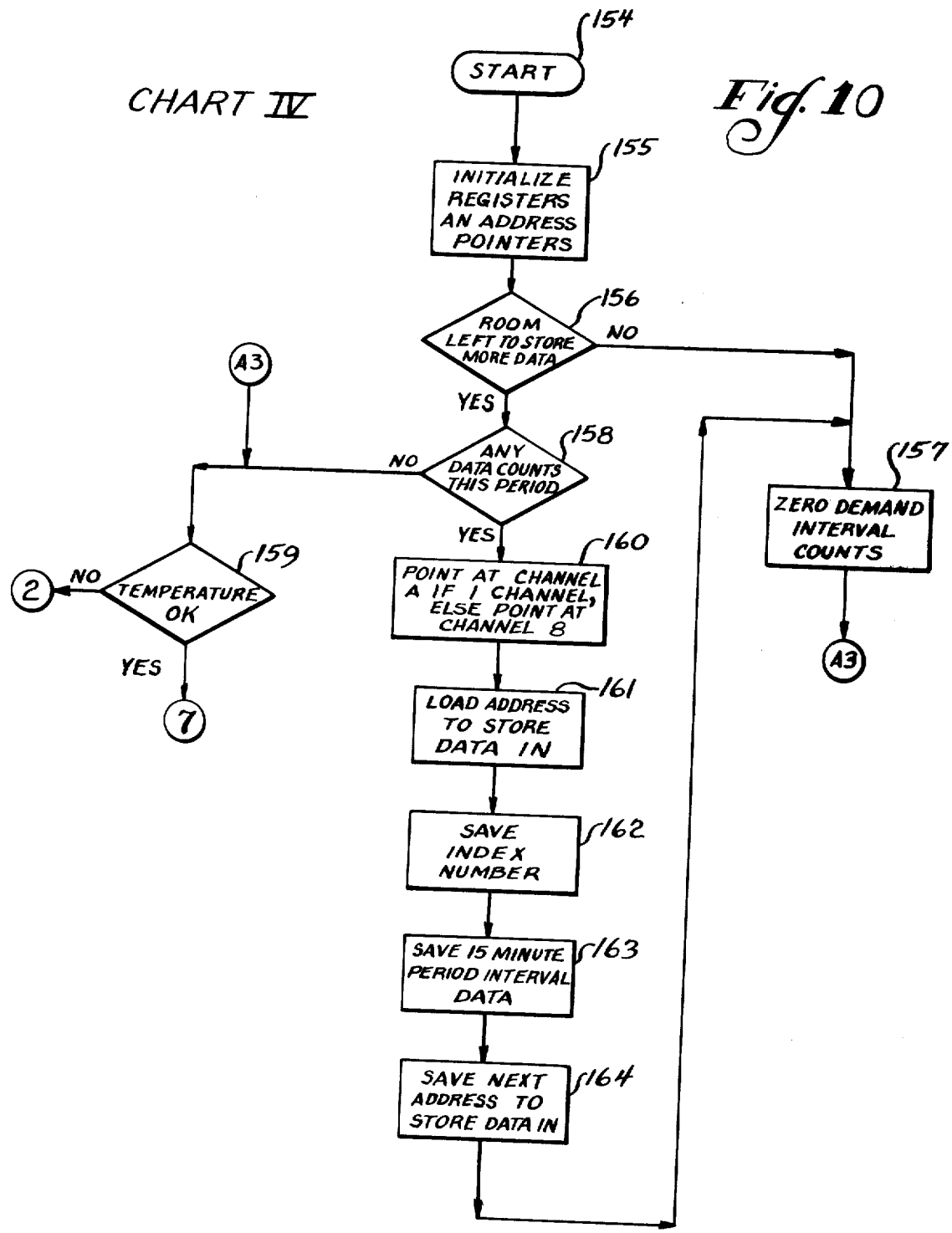

LIST 1

LIST 2

BILLING RECORDER WITH NON-VOLATILE SOLID STATE MEMORY

BACKGROUND OF THE INVENTION

The present invention relates to recording apparatus for recording measured event data along with a time reference for the event data; and more particularly to a recorder of the type used by electrical utilities to record energy consumption by customers. The recorder includes non-volatile memory providing permanent storage for usage (i.e. event) data along with time reference data and which can be removed at the end of a billing period for remote tabulation or load analysis and replaced with an unrecorded memory for the next billing period.

Billing or survey recorders are used by electrical utility companies for recording the event data provided by an electrical meter which indicates the amount of energy used by a consumer. The billing recorder accumulates data for a period of time called a read or billing period, typically a month long, and it also stores time signals or "marks", generated by the billing recorder. A time mark is simply a signal recorded at a predetermined interval (called "demand" periods) during which the associated event data occurred. That is, the distance between time marks on the tape define a predetermined time period, assuming the tape speed is constant and the same for both recording and playback. Demand periods conventionally are 5, 15, 30 or 60 minutes.

The event data and the time marks of conventional recorders are typically recorded on magnetic tape in a cartridge to allow processing or analysis of the data at a central translation center which is remote from the point of service. The recorded data provides time marks and event data pulses for customer billing and load analysis, but it does not provide data representative of a particular start time or the source (recorder) from which it came. Start and stop times, customer identification such as meter or recorder number (I.D.), and beginning and end meter register readings are all recorded in writing by the exchange personnel, thereby leaving considerable room for human error. When such error does occur, any loss must be suffered by the utility, not the consumer.

Most billing recorders in use today employ magnetic tape as the storage medium, even though magnetic tape has temperature and humidity limitations which make it less reliable as a storage medium than is desired in the demanding environment of use by a utility. The tape must be advanced past the record head continuously and at a precise speed during recording. Accordingly, a complex mechanical tape drive system is required to insure proper operation at all environmental specifications. The requirement of drive motors for advancing the tape adds considerable cost and limits miniaturization of the unit. Also, periodic servicing is required to maintain the recording mechanism drive elements, battery carryover system, and to periodically clean the recording head.

It will be appreciated that such recorders are required to operate in a wide range of temperatures (typically −20° C. to +65° C.), due to the worst cases of heat and cold they are likely to encounter over the large geographical area in which a given model is marketed.

A further consideration affecting cost, reliability and performance is that billing recorders employed for recording data representing electrical energy usage are occasionally subjected to power interruptions. In recent years, there has been a trend to employ power outage circuits which provide transfer to an auxiliary power source, such as a battery during intervals of primary power loss. It is evident that maintaining the drive to the tape advance motors during primary power loss results in a heavy drain on the battery, thereby limiting the carryover time for which recording can be continued. This is particularly disadvantageous in cold climates.

SUMMARY OF THE INVENTION

The present invention provides a billing recorder which includes a non-volatile, solid-state magnetic memory, such as a magnetic bubble memory, for storing event data representative of electrical energy consumption measured by an electric utility meter. Solid state memory has the significant advantage that energy need not be spent on mechanical motion of the storage medium; and bubble memories are advantageous because the data is not lost if power is lost. A controller, including data processing circuits receives pulses generated by a pulse initiator associated with the electric meter and generates coded event data words representing the number of event (i.e. measurement) pulses received during predetermined demand intervals. The data, along with time reference data is transferred to the solid state memory at the end of a period called a "collection" period, which may include a number of demand intervals.

During a collection period, the controller temporarily stores the event data in random access memory. At predetermined clock times marking the end of a collection period, such as every four hours, the controller transfers the event data (i.e. quantized measured data for all intervening demand intervals comprising a collection period) to the bubble memory which serves as a permanent data storage for the event data. Time reference data is generated by the controller, and it is transferred to the bubble memory at the same time as, and in association with, the event data for defining the period over which the event data was obtained. To conserve memory, the time reference data is stored only once for a number of demand intervals, and the quantized event data is stored in predetermined memory locations associated with respective demand intervals so that when event data is recovered from known storage locations, it can readily be determined with which demand interval the recovered event data is associated. For example, for a "normal" record (i.e. separate provisions are made for insertion and removal of the module, as will be discussed), encoded time reference data identifying only the beginning of the collection period is generated and stored. A collection period is thus the time between transfers of event and time reference data temporarily stored in random access memory in the controller before being transferred to the solid state memory for more permanent storage.

The state of the art in bubble memory manufacture is such that a separate memory, called a "mask" memory or mask ROM (read only memory), is associated with each bubble memory to indicate which minor loops are not available for use due to failure to operate or meet performance specifications. For example, a memory may have 157 or so minor loops and only 144 of these are required because one "page" of memory is 144 bits (18 bytes of 8 bits each). Further, each memory normally has associated with it a resistor for compensating for temperature variations in the write current. The mask ROM and compensation resistor associated with each memory may be provided by the manufacturer; and in any case, since they are associated with a particular memory they are packaged with the memory in what is referred to as the memory module.

The bubble memory module is mounted on a removable memory card which facilitates removal of the bubble memory from the recorder apparatus at the end of a billing period, and the insertion of a new, erased bubble memory card. All of the recorded memories are then taken to a translation center for further processing of the recorded information. Each of the memory modules is provided with a visual indicator to indicate to exchange personnel whether the memory is erased or recorded.

The controller may include a microprocessor including a Central Processor Unit (CPU), Read Only Memory (ROM), and Random Access Memory (RAM), together with associated buses and interface circuitry. A device is associated with the memory card to signal to the system that the memory module is going to be replaced. In the illustrated embodiment, this device takes the form of a mechanical latch which locks the memory card in place in one position and permits its removal in another position. Other sensing mechanisms may equally well be employed, but it is preferred that some action be required on the part of exchange personnel, in the form of mechanical motion or the like, to permit a short time delay between actuation of the device prior to removal to unlock the memory module or permit access to it, and the actual removal of the memory module. Actuation of the device to the removal position signals the microprocessor that removal is imminent, and the microprocessor prepares a special Removal Record in Random Access Memory and transfers this data along with the event data for the partial collection period up to actual removal to predetermined locations in the bubble memory.

After the new memory module is inserted in the recorder and the exchange person actuates the device to the operative position, the microprocessor prepares a special Insertion Record which is normally transferred to the bubble memory at the end of the current collection period. These special Removal and Insertion Records contain the time and date of insertion or removal, an identifier number permitting the utility to identify the recorder, and the event data for the partial collection period prior to removal of following insertion, as the case may be.

Further, each record (Insertion, Removal or Normal) contains a total count (called a "running total") of measured events for each collection period. That is, the total count for all demand intervals for a collection period is added to the previous running total and stored as an integral part of the new record for that collection period. In the case of two input channels, the running totals are stored in alternate records for each channel. The Insertion and Removal Records include these running totals, but in addition, they include total counts of larger magnitude (called "Insertion Total" and "Removal Total" respectively) for each channel which is representative of cumulative event data for collection periods at the time of replacement of a memory module. These total counts establish continuity of data from one memory module to another without loss of data.

When a memory card is to be removed before the end of a full collection period, the operator has to move a mechanical latch to the unloaded position before the memory card or module can be removed. The unlatching operation is sensed by the microprocessor which then prepares the Removal Record for the partial period up to that time, and stores it in the bubble memory in the brief period before the card is removed. A visual indicator mounted in the memory module indicates whether the memory module is erased or recorded.

Another aspect of system design to be considered is operation of the bubble memory at elevated temperatures. This can be a limitation because of manufacturer's upper temperature operating specification for a bubble memory system manufactured according to available technology is about 70° C. If the bubble memory is operated continuously, the temperature rise due to applied power alone is 20° C., thereby limiting the environmental temperature to 50° C.

The present invention energizes the bubble memory only during the access time between collection periods, accumulating data in the Random Access Memory of the microprocessor for the complete collection period and assembling it in a predetermined format for storage in the bubble memory. This is considered an important advantage of the present invention because for collection periods of four hours, the average temperature rise of the bubble memory is less than 1° C.

This has been found to greatly relax the environmental stress on the bubble memory module, and as indicated above, a wide range of operating temperatures is important in the particular application with which the present invention is primarily concerned. Energizing the memory module only during access times also conserves power during power outages when conservation is important. By using CMOS technology in the controller, microprocessor and logic circuitry, carryover time can be extended substantially over prior magnetic type recorders which power the tape drive continuously.

The present system also enables the temperature specifications on the system to be set lower than the temperature specifications on the solid state memory. Again, this is important because of current limitations imposed by manufacturers of bubble memories. If, for example, the lower temperature specification set by a manufacturer on a bubble memory is 32° F., but for commercial reasons it is desirable to set the temperature specifications on the billing recorder at −20° F., a problem is presented if it is desired to take advantage of intermittent energization of the bubble memory as explained above. This is desirable because it conserves power and reduces the size of the battery required for battery carryover during power outages. Once a power outage is detected, allowance must be made for the fact that the temperature of the bubble memory may fall below its lower specification—namely, 32° F. The present system incorporates a thermal recovery period to insure that bubble memory will be within specification for its operating temperature before writing into it. In order to account for this and to minimize the chances of data loss during a power outage, a separate section of Random Access Memory is provided. For convenience, this is sometimes referred to as RAM II. If a power outgage (plus the thermal recovery period) would span into a collection period subsequent to the collection period in which the power outage first occurred, the system enters into a special power outage recovery mode.

Briefly, according to this recovery technique, at the end of the collection period in which the power outage occurred, the event data is transferred to RAM II portion of memory in the controller, and the portion of Random Access Memory thus evacuated, called RAM I, is used for storing data in a different format. The microprocessor is programmed such that when a power outage is detected, it uses its own internal clock to generate time reference data, and an index counter is incremented each demand interval. If power is not returned during a demand interval, the index counter is incremented but event data is not stored (since the power outage continues). Thus, memory space is not used for those demand intervals during which line power is not available. If power is returned for a period of time less than the thermal recovery period (for those systems which require thermal recovery periods due to manufacturer's specifications on the bubble memory), the contents of the index register representative of a demand interval and the associated event data are stored in RAM I. In this manner, storage is used most efficiently only for those demand intervals during which power was being applied. The system then writes the data into the bubble memory at the end of a thermal recovery period by transferring the contents of RAM II first and then re-constructing the data temporarily stored in RAM I into the required format in RAM II and then writing that data into the bubble memory. As data is taken from RAM I, converted into the original format and transferred from RAM II for storage in the bubble memory, the remaining data in RAM I is advanced in memory, similar to the operation of a stack memory, so that as much space as possible is made available for data storage in the event of a subsequent power outage prior to the time all of the data in RAM I is converted and stored in the bubble memory. Obviously, because the bubble memory is non-volatile, data stored in it is not affected by a power outage. If a power outage has occurred, notation is made in a predetermined location in the formatted data transferred to the bubble memory. In particular, three bytes of bubble memory are reserved for each collection period for storing running totals of event data. In the case of a two-channel recorder, the running totals for each channel are stored in alternate records. Of the available twenty four bits, the first twenty (B00-B19) are reserved for the running totals for the respective channels, and bits B20 and B21 are set to "1" is there is detected a failure of the read after write test so that a translator will be able to detect that such a failure occurred during the writing of the data for that particular collection period.

Existing recorders have a field test function. That is, when a meter reader replaces a magnetic tape cartridge in a recorder of the type currently used, he carries with him a portable field tester which plugs into a receptacle on the meter, and is equipped with two visual indicators (in the case of a 2-channel recorder). These indicators flash on and off as the pulse initiators associated with the induction driven disc of the meter change states to indicate the consumption of electrical power. This gives an indication to the reader that both incoming channels and the associated initial processing circuitry are operative. Since the readers are accustomed to associating flashing visual indicators with tests for operativeness, it is desirable to continue this type of testing. The present invention does not require a portable plug-in unit for field testing. Rather, one of the switches used to display and set the various system parameters such as I.D., time, date, etc., is used to sequence the display of these words on a 5-digit digital display. Normally hours and minutes are displayed, and the first time the set switch is actuated, the system enters a field test mode in which the signals from the pulse initiators are coupled through the input circuitry to be displayed either as a "1" or a "0" on an associated digit of the digital display assigned to that channel. Thus, in the case of a 2-channel recorder, the first digit of the display would be assigned to channel A, and so on. The digit displayed would alternate between a "0" and a "1" as the pulse initiator associated with that channel changed states in response to the consumption of electrical power. In this manner, the exchange personnel can rapidly and simultaneously check not only the meters for all of the channels but most of the electronic circuitry associated with receiving and processing the associated signals.

Another advantage of the invention accrues from the use of a digital display for the various words used in the system in that these words, such as time, date and I.D., can be selectively displayed and set in the field. If, for example, exchange personnel during a routine memory exchange at the end of a billing period determines that a recorder is malfunctioning, he may have an extra recorder with him and easily replace the faulty recorder with an operative one, and set the time, date and I.D. without having to make a separate trip or return to the factory. This assumes that the recorder is a "plug in" construction, which the illustrated embodiment is not. Of particular importance is the ability to set the identification number for that recorder because this information is recorded both in the initial Insertion Record and the final Removal Record. Thus, subsequent replacements of the bubble memory module can be made without fear of human error as to the recording of the identification number. In the past, field personnel did not have the ability to set the identification number of a recorder and inefficiency and hardships resulted therefrom.

Still another advantage of the present system is by means of a simple jumper lead or switch the same system can accommodate various use options, such as Daylight Saving Time, one or two input channels, or 50 or 60 Hz. line frequency. In the case where a recorder accommodates changes to and from Daylight Saving Time, when time changes from Daylight Saving Time to Standard Time, two special records are prepared and stored so that no data is lost as a result of the changeover.

After the controller writes each page of data in the bubble memory, it reads the same data and compares it with the data intended to be written. This is referred to as a "read after write" test. If the recovered data is verified, the controller proceeds to write the next page of memory. If an error persists after repeated attempts, a notation is made in a predetermined location in the running total data as mentioned.

In a disclosed option, the billing recorder has an associated data transponder (modem) which permits the billing recorder circuits to be coupled to a communication link to permit reading the bubble memory and transmission of the data to a remote translating center by way of a communication link.

DESCRIPTION OF THE DRAWING AND FLOW CHARTS

FIG. 1 is a functional block diagram of a system incorporating the present invention;

FIG. 2 is a block diagram of a magnetic bubble memory for the system shown in FIG. 1;

FIG. 3 is a diagrammatic representation of a removable memory card used in the billing recorder;

FIG. 4 is a block diagram of a system which permits readout of the memory data by way of a communication link;

FIG. 5 is a diagrammatic front view of a recorder according to the invention.

FIG. 9 (Chart III) is a flow chart describing the operation of the system during Power Fail Mode II for recording power outage data in the bubble memory; and FIG. 10 (Chart IV) describes the operation of the system during Power Fail Recovery Mode II for storing data in Random Access Memory during a power outage.

Figure 11:
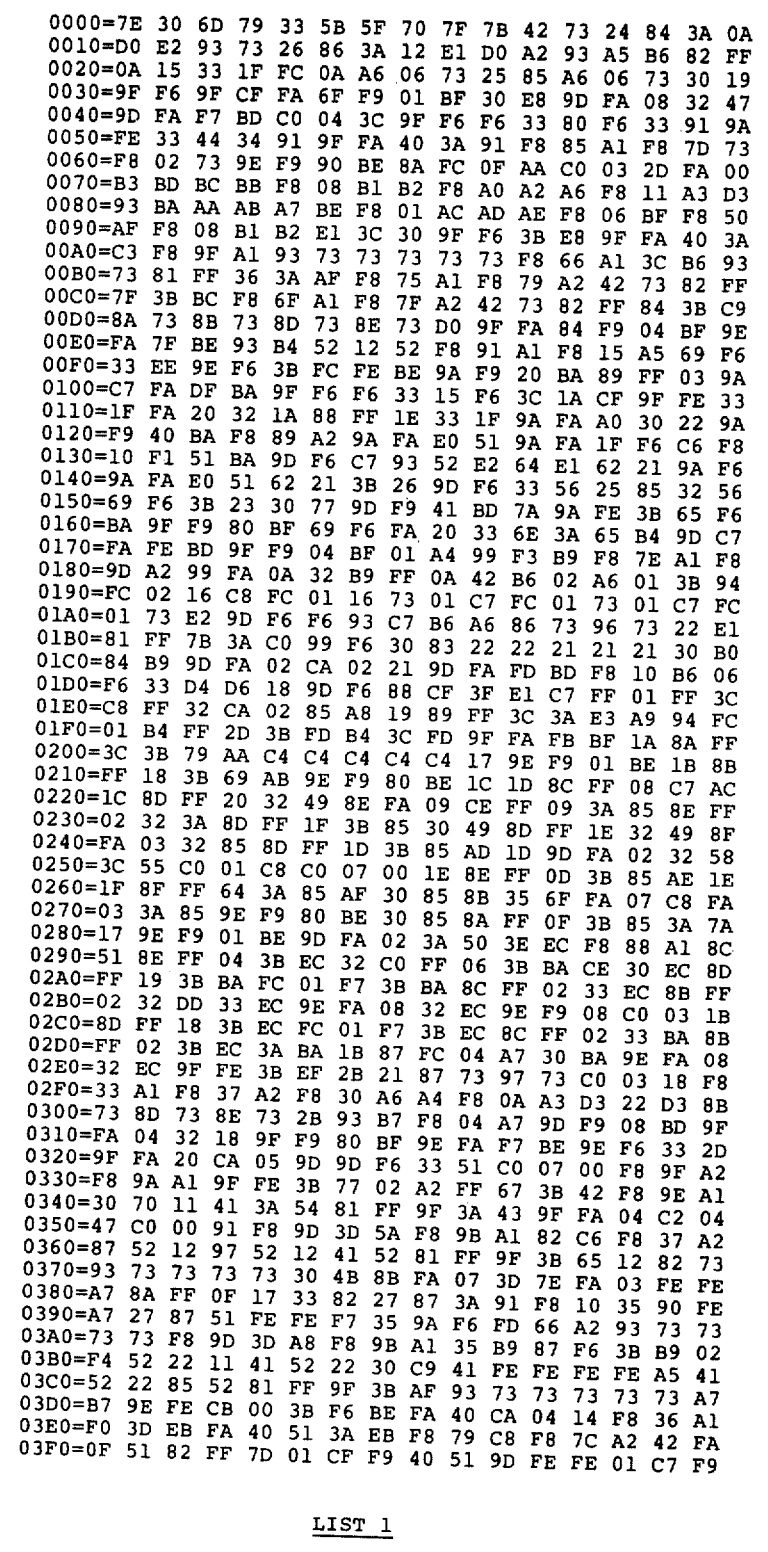
Figure 12:
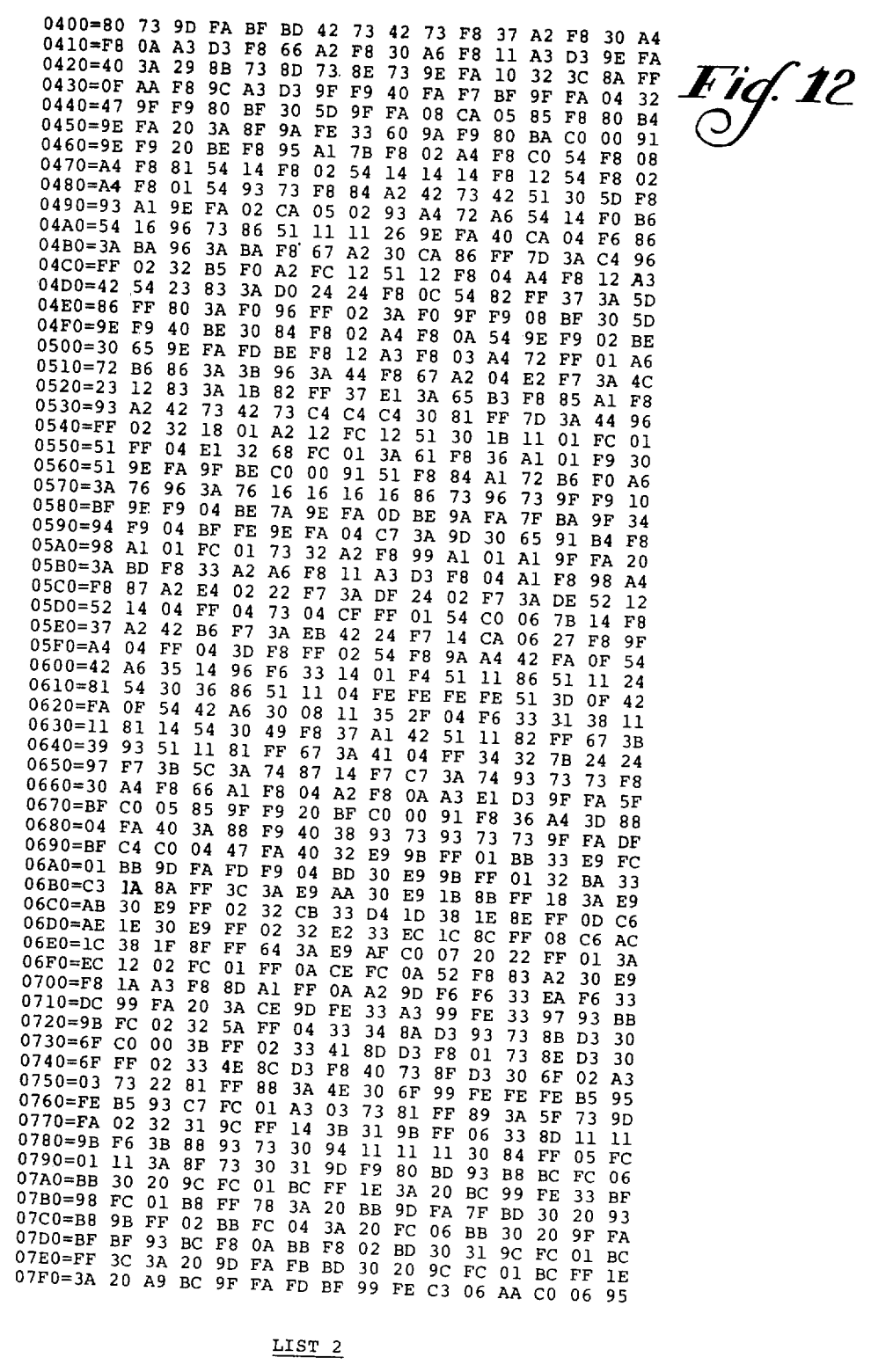
Figure 6:
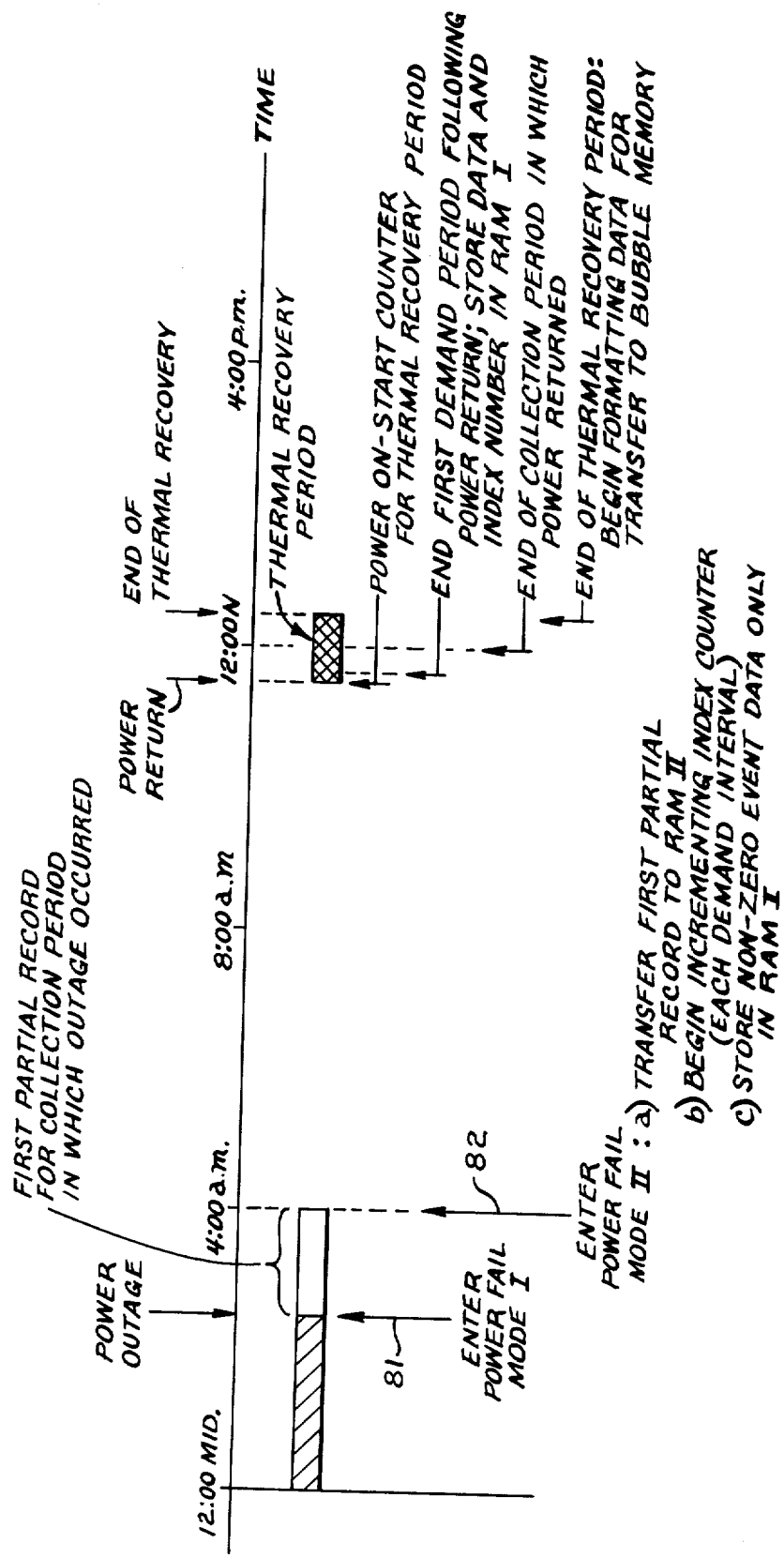
FIG. 6 is a timing diagram illustrating the power fail modes.
Figure 7:
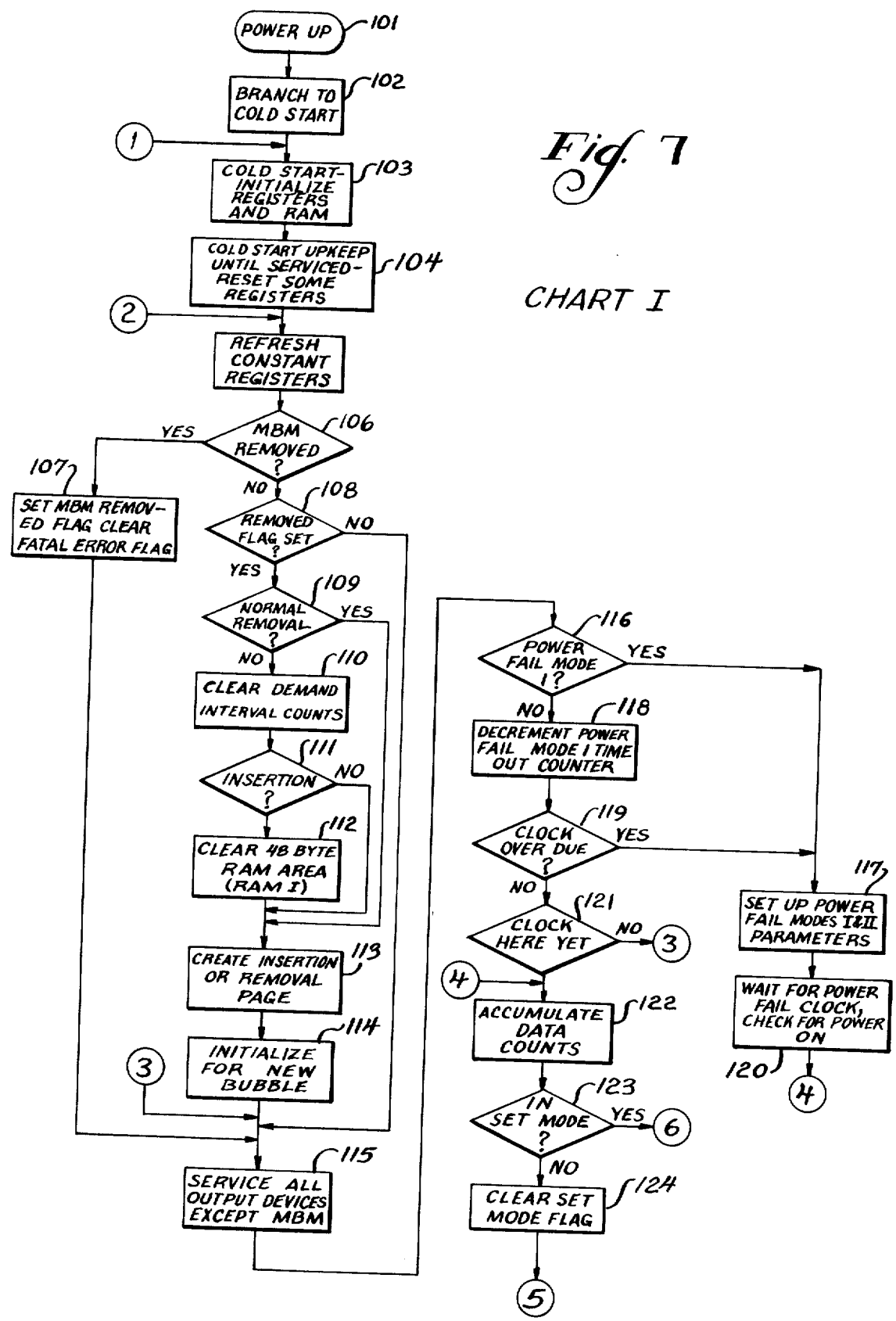
FIGS. 7 and 8 (Charts I and II) are flow charts describing the overall system operation.
Figure 8:
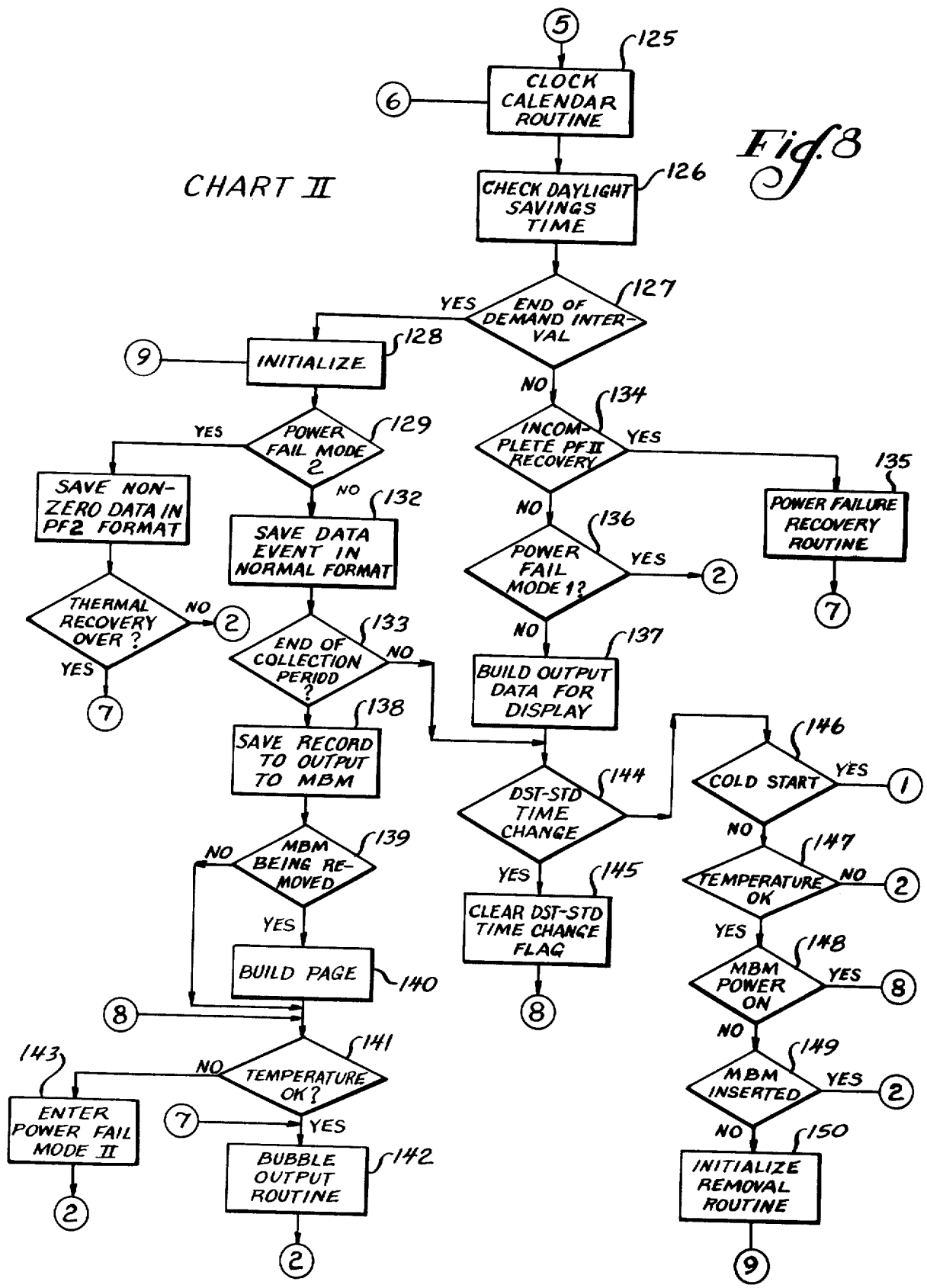

FIGS. 11 and 12 (Lists 1 and 2) comprise a detailed code listing for a computer program incorporated into the present invention.

DESCRIPTION OF A PREFERRED EMBODIMENT

Referring to FIG. 1, the billing recorder provided by the present invention records quantized measurement or "event" data provided by an electric utility meter which measures electrical energy consumption. Each pulse from the meter represents the consumption of a predetermined amount of energy or reactive power. At periodic billing intervals, typically a month, the event data recorded is processed at a translation center for billing the customer or to provide load analysis data. The recorder may be a multichannel recorder; and in the exemplary embodiment the recorder is illustrated as a two-channel system which receives measurement data from two sources over separate data channels A and B.

Briefly, the event data is fed to the recorder circuits over two data channels A and B (which may be separate sources or two different quantities from the same source), and stored in a non-volatile solid state memory 23, such as a magnetic bubble memory, under the control of a controller which includes a microprocessor 11. Alternatively, the data from two sources may be totalized before preparation of the record to be stored, and then stored in a totalized format. The controller processes the incoming data by accumulating it in predetermined time intervals called "demand" intervals prior to storage in the bubble memory 23 and controls the writing of the processed data into the memory 23.

Referring to FIG. 1 the microprocessor system 11 includes a central processing unit (CPU) 16, a read only memory (ROM) 17, the random access memory 18, a time reference generator 13, and an input/output (I/O) interface 19. The CPU 16, which may be a Type CDP1802 Microprocessor manufactured by RCA, Inc. which uses CMOS circuits to conserve power, processes the event data pulses received from the input/output interface 19 via data bus 51 and stores the processed data in the RAM 18 for each demand interval over a complete collection period before writing it in the magnetic bubble memory 23. The ROM 17 stores the control instructions for the CPU 16.

The event data supplied to the recorder circuits is coupled over the data channels A, B, C and D (which are latches) in the form of pulses generated by conventional pulse initiator devices (not shown), one for each channel. The illustrated embodiment may accommodate one or two separate input channels, such as A and B, designated 19A and 19B, at the option of the customer. In addition, if desired, additional channels 19C and 19D may be provided for and totalized respectively with 19A and 19B. The initiators may be of the type sold by Sangamo Weston, Inc., under the designation SPI. Each level change at the output of the initiator represents the consumption of a predetermined quantity of electrical energy. This train of pulses is fed to the controller via input/output circuit 19.

The incoming data is processed by the microprocessor which accumulates the quantized data in predetermined demand intervals and provides temporary storage in a Random Access Memory (RAM) 18 for a fixed number of demand intervals (it could be any number, one or more) which comprise a collection period. During this time, the microprocessor prepares the event data and time reference and other information, which will be described, in a format for recording; and the bubble memory is not energized. The bubble memory is energized only as necessary for writing data at the end of a collection period. Such write times are referred to as access times.

The controller includes a digital clock/calendar which provides time reference information for defining the demand intervals in real time. The controller stores date and time information representative of the beginning of a collection period. For the two-channel recorder illustrated, the microprocessor accumulates the pulses transmitted over each data channel for demand intervals of fifteen minutes duration for a collection period of four hours, and generates data words representing the number of pulses accumulated for each channel for each of the sixteen demand intervals of a collection period.

For a "normal" collection period (i.e. one in which there is no power outage or no insertion or removal of a memory module), these data words are formatted together with time reference data (month, day and hour) and a running total count. The normal record data is transferred from the RAM 18 to the bubble memory at the end of each collection period during the access time.

To conserve storage space in the bubble memory, time reference data is not stored for identifying each demand interval; rather, the event data is formatted by the microprocessor such that the event data for successive demand intervals is assigned to and stored in predetermined memory locations. If additional memory space is available, of course, or if it is otherwise found to be desirable, additional time reference data may be stored for each normal record. Twelve bits of memory (4095 resolution) are allocated for each demand interval per channel. This is one and one-half bytes. In the case of a two-channel recorder, the event data for one demand interval for Channel B is followed for the event data for the same demand interval for channel A.

In addition to the normal record data described above, the microprocessor prepares a separate Removal Record for storage in predetermined locations of the bubble memory when it receives an indication from the exchange personnel that a memory module is being replaced. Further, after an erased memory module is inserted, the microprocessor prepares a special Insertion Record which is recorded at the beginning of the newly inserted bubble memory. Both of these records will be explained in further detail below.

The bubble memory 23 of this exemplary embodiment is capable of storing data accumulated over a period of approximately thirty-five days (i.e. 213 4-hour collection periods). The bubble memory module is mounted on a removable card, represented by the dashed line 24, in FIG. 2, to facilitate replacement of the "recorded" memory module with an erased (zeroed) memory module at the end of each billing period. After removal, the recorded memory is transported to a translation center where the data is translated. The memory is then preferably erased for reuse, although this is not absolutely necessary since the microprocessor could have an erase subroutine before writing.

Referring to FIG. 3, the memory card or module 24 contains the bubble memory itself, designated 23, a Read Only Memory 45 which contains the information identifying usable minor loops, a memory readout circuit 46 which may include a sense amplifier, and the temperature-compensating write resistor explained above. The card includes printed circuit conductors which provide the necessary interconnections between the elements of the bubble memory card and terminals 24A of an edge connector 24B which is insertable into a receptacle 24C (see FIG. 5) on the front of the billing recorder unit.

A device generally designated 49 is used to signal the microprocessor that the recorded memory module is going to be removed and an erased module inserted. This defines the end of a collection period. Preferably the device 49 requires some action by the operator to be accomplished a short time before actual removal. This delay may be as short as 100 milliseconds, and the purpose is to give the microprocessor sufficient time to prepare the Removal Record and transfer it to the memory module before actual removal. In the form illustrated, the device 49 includes a handle 49A which is rotatable between a locking position shown in solid line which prevents removal of the module 24, and a removal position shown in dashed line which permits removal of the module. The handle 49A is mounted on a shaft 49B which contains a cam 49C. In the locking position, the cam 49C engages a first contact 49E and may provide a ground for that contact. When the handle 49A is moved to the removal position, the microprocessor prepares the Removal Record and transfers it to the memory module 23. When the new module is inserted and the handle 49A is moved to the locking position, the microprocessor senses this signal and prepares an Insertion Record and transfers that record to a predetermined location in the newly inserted memory (preferably, the first four pages thereof, as will be described).

Devices other than the locking handle 49A could equally well be employed, for example, a cover or lid pivotally mounted to the face of the recorder unit which would be required to be opened before removal of the module could also be used. It is not necessary that it be directly associated with and lock the module in place, but it is believed that such a device would minimize error on the part of the replacement personnel, which could cause loss of data.

To further minimize error, the memory module is provided with a visual indicator such as that shown at 47 in FIG. 3 for indicating whether or not a particular memory module is recorded or erased. Such devices are commercially available and may comprise a magnetic bistable element which, if magnetized in one polarity will exhibit a first color and, if magnetized in the opposite polarity will generate a second, easily distinguishable color. This may be accomplished by transmitting the write current in one direction in a loop or coil associated with the indicator 47 to generate the first color during insertion, and by transmitting the erase current through the coil in the opposite direction, thereby generating the second color, upon erasing. Alternatively, a mechanical indicator responsive to being inserted in the recorder to give one visual indication (of recorded data) and responsive to being inserted in the reader to give a second visual indication of being erased, may be used.

The Removal Record which is recorded just prior to the time the recorded memory module is removed and after operator actuation of the device 49, includes time reference data representing the month, day, hour and minute of module removal as well as partial period event data. The event data is stored in particular memory locations as defined by a predetermined memory map, which are preassigned to the respective demand intervals. Those locations associated with demand intervals for a partial collection period after removal are filled with zeros (that is, no event measurement data is inserted). The partial collection period event data is stored temporarily in RAM 18 and and transferred just prior to removal of the memory module as indicated. The Removal Record also includes an identifier code which identifies a customer or customers by correlating the memory module with a particular billing recorder from which the memory had been removed. Total pulse counts for the two channels A and B are also recorded as part of the Removal Record.

The Insertion Record is recorded at the end of the partial collection period following insertion of an erased memory module. This record includes time information, month, day, hour and minute of module insertion, and a five digit BCD identifier code. In addition, time data representing the month, day and hour defining the current collection period is recorded as part of the Insertion Record along with any event data stored in RAM 18 at the end of the collection period. The event data is stored in particular memory locations associated with demand intervals for the collection period prior to insertion are filled with zeros.

The recorder circuits normally obtain power from an AC line source, but include battery carryover to maintain selected circuits energized in the event of an AC power outage. A power supply circuit 14 provides the required DC levels for the microprocessor system 11 via a power bus 50. A DC to DC converter 28 is energized by the AC line power or, if that is not present, the battery, via solid state swiich 29 under control of the CPU 16 which continuously senses for the presence of the 60 Hz. line signal for determining whether a power outage or failure is present. The converter provides the required DC levels for the bubble memory and its associated drive circuitry, which comprise the magnetic bubble memory system 12. By means of the switch 29, the microprocessor de-energizes the bubble memory system during collection periods and selectively energizes it only for data transfers at access times at the end of normal collection periods or at removal/insertion times.

In the case where the operating temperature specifications of the bubble memory meet or exceed those for the entire recording system, the solid state switch 29 may be energized by the CPU 16 at the end of every data collection period for writing whatever data might have been accumulated during that period, without depleting the battery substantially since it takes less than about 100 milliseconds to write all of the data for a complete collection period. However, where the temperature specifications for the bubble memory do not meet the overall operating temperature specifications for the recorder system, particularly where the recorder system is required to operate at a temperature below the manufacturer's specification for the bubble memory, the present system does not permit the writing of any data into the bubble memory (due to the possibility that data might be lost or errors might occur if the temperature of the bubble memory has in fact fallen below its operating specification), and the CPU 16 further initiates a thermal recovery period which may be 45 minutes upon the return of AC line power by sensing a 60 Hz. signal on the line 30. As will be described more fully below, a special power recovery or power failure mode is implemented by the CPU and such a system will have additional Random Access Memory 18 in which to store event data between the occurrence of a power outage and the termination of a thermal recovery period in a manner that will optimize the use of the additional memory, as will be understood from subsequent description.

Time reference data is generated under program control by the microprocessor in units of minutes, hours, days, months, day of the week and year. The time base generator 13 includes a 60 Hz. signal received directly from the power line by the CPU. A crystal oscillator 32 and digital countdown circuit 33 provide an auxiliary timing signal input to the CPU in the event of loss of primary AC power. The latter signal has a frequency of approximately 61 Hz.

The CPU 16 counts the pulses transmitted over each data channel A and B separately for the demand intervals. During each demand interval, the number of pulses received from each channel is encoded into a twelve bit binary word (one and one half bytes) representative of the total count, and this word is stored in the RAM 18. At the end of each full collection period, the sixteen data words (for a four-hour collection period and 15 minute demand interval) for each channel together with all other data comprising a complete record, as will be described, are transferred via data bus 51 from the RAM 18 to the bubble memory 23, under the control of the CPU 16.

The magnetic bubble memory system 12 includes a memory control circuit 21, a drive circuit 22 and the bubble memory module 23. The bubble memory systems are commercially available, and accordingly its structure and operation are not described in detail. Bubble memory systems are available from Texas Instruments, Inc., Dallas, Tex.; and they are described in a publication by the same company entitled "Magnetic Bubble Memories and System Interface Circuits", 1977 which is incorporated herein by reference. The drive circuit 22 includes a function driver 43 and coil drivers 44. The memory controller 41 responds to commands from the microprocessor system 11 and enables the necessary control functions to the function timing generator 42 to access a page (or pages) of the memory 23.

For a write operation, the CPU 16 supplies an address to the controller via address bus 48, and writes the data into an input buffer 41A of the memory controller 41. The memory controller 41 accesses the proper page and effects writing of the data into the memory. For a read operation the CPU 16 generates an address to select the module locations, loads the controller 41 with the proper page number and generates a read command. The memory controller accesses the designated page and stores the data in its buffer 41A. The memory controller 41 also synchronizes the operation of the memory control circuits and the operation of the bubble memory module.

The function timing generator 42 provides input timing control to a function driver 43, a coil driver 44 and a readout circuit 46 on a per cycle basis. The function timing generator, under the control of the memory controller 41, generates five functions, including generate, replicate, annihilate, transfer in, and transfer out for the two function drivers. The function timing generator also provides control signals to the coil drivers to maintain the proper phase relationship between the coils in each of the memory modules.

The function driver 43 converts logic level signals from the function timing generator into an analog form usable by the memory module 23. The coil drivers 44 respond to outputs of the function timing generator 42, and generate the proper current waveforms for driving the bubble memory devices.

The bubble memory module for the two channel system comprises a Texas Instruments Type TBM0103 bubble memory module which provides 641 pages of non-volatile, solid state memory having 18 bytes of data per page with 8 bits per byte. The assignment of the bubble memory store locations is illustrated in Tables I, II and III which show, respectively, memory assignments for pages 1-4 (Insertion Record); pages 5-7 (comprising one Normal Record), and pages 638-641 (Removal Record). In all cases, other than module insertion/removal (and power recovery after an outage), the information is written from the RAM 18 to the bubble memory at the normal access time at the end of collection periods. In the illustrated embodiment, these occur every four hours starting at midnight.

TABLE I

| Page | Data | No. of Bytes |
|---|---|---|
| | INSERTION RECORD | |
| 1 | Month, day, hour, min. (of Insertion) | 4 |
| | Identifier Number (I.D.) | 5 |
| | Insertion Total Count (Channel A) | 3 |
| | Insertion Total Count (Channel B) | 3 |
| | (zero-filled) | 3 |
| 2 | Month, day, hour (Start of Current Collection Period) | 3 |
| | Event Data for Channels A and B for five Demand Intervals | 15 |
| 3 | Event Data for Channels A and B for six Demand Intervals | 18 |
| 4 | Event Data for Channels A and B for five Demand Intervals | 15 |
| | Running Total (Channel A or B, depending on which had been written last) | 2½ |
| | Status | ½ |

TABLE II

| | NORMAL RECORD | |
|---|---|---|
| 5 | Month, day, hour (Start of Current Collection Period) | 3 |
| | Event Data (A and B for five Demand Intervals) | 15 |
| 6 | Event Data (A and B for six Demand Intervals) | 18 |
| 7 | Event Data (A and B for five Demand Intervals) | 15 |
| | Running Total (A or B, alternatively) | 2½ |
| | Status | ½ |

TABLE III

| | REMOVAL RECORD | |
|---|---|---|
| Page | Data | No. of Bytes |
| 638 | Month, day, hour, min. (Removal Time) | 4 |
| | Identifier Number (I.D.) | 5 |
| | Channel A Removal Total Count | 3 |
| | Channel B Removal Total Count | 3 |
| | (zero-filled) | 3 |
| 639 | Month, day, hour (Collection Period Start Time) | 3 |
| | Event Data (A and B for five Demand Intervals) | 15 |
| 640 | Event Data (A and B for six Demand Intervals) | 18 |
| 641 | Event Data (A and B for five Demand Intervals) | 15 |
| | Running Total (A or B) | 2½ |
| | Status | ½ |

The records to be discussed presently are illustrations for a two channel (A and B) recorder since the single channel device is more simple. With reference to Table I, the first page of an Insertion Record contains the time (current month, day, hour and minute) of module insertion in the first four bytes and a five-digit Identifier Number (in BCD format and comprising the I.D. referred to throughout) is contained in the next five bytes. The Channel A and Channel B Insertion total counts (i.e. cumulative counts of event data as of the time of insertion) are each contained in three bytes and the remaining bytes of the first page are zero-filled. The remaining three pages of an Insertion Record are the same as a Normal Record, to be discussed presently, except that the memory locations associated with demand intervals that have transpired prior to insertion for the current access period are zero-filled up to the location associated with the current demand interval. The event data for remaining demand intervals for the current collection period are entered in the normal fields for that record.

With reference to Table II which illustrates a Normal Record, data for each collection period is recorded on three pages of the bubble memory in the following order. The first three bytes of the first page store the time (month, day, and hour) of the commencement of the collection period for which the associated event data is stored. The next forty-eight bytes record the measured event data for Channel A and Channel B for the sixteen 15-minute demand intervals comprising the four-hour period collection. It takes twelve binary bits (one and one-half bytes) to record up to 4096 ($2^{12}$) event pulses for a given channel in one demand interval. Hence, in the case of a two-channel recorder, the twelve bits for Channel A are recorded in one full byte (memory word location) and the first four bits of the next succeeding byte. The event data for Channel B for the same interval is stored in the last four bits of the second byte mentioned and the full eight bits of the next byte. The order of storage makes no difference as long as it is accounted for in the software of the translator (actually Channel B data is recorded first).

Running Total count for Channels A and B is recorded in alternate Normal Records in two and one-half of the last three bytes of the third page. Thus, the Running Totals are cumulative counts of measured event data which are up-dated at the end of each collection period.

One-half byte (four bits) of storage is reserved for status information. Bits B20 and B21 are reserved for failure indication of the Read-After-Write test. Bit B22 indicates whether the accompanying Running Total for that record is associated with Channel A or Channel B. Bit B23 indicates whether a power failure has occurred during the collection period associated with that record.

Referring to Table III which defines a Removal Record, upon removal of the memory card, the partial period data is written into pages 638–641. Page 638 contains the time (month, day, hour and minute) of module removal in the first four bytes and the I.D. code in the next five bytes. The Channel A Removal Total count is recorded in bytes 8–10 and the Channel B Removal Total is recorded in bytes 11–13. The remaining bytes of page 638 are zero-filled. The last three pages are similar to a Normal Record (Table II) except that the partial data for the period of removal is written into the memory locations associated with demand intervals prior to removal, and the remaining locations representing subsequent demand intervals are filled with zeros.

To illustrate the various records just described, reference is made to Chart A in which the left-hand column indicates running time. Assuming four-hour collection periods, at time 1200, a Running Total for Channel A is transferred as part of a Normal Record (Table II) to a first solid state memory module. Assuming that the first memory module is to be replaced at 1415, when the handle 49A (FIG. 5) is turned to the removal position, the contacts 49C, 49E open; and the microprocessor prepares a Removal Record (Table III). The Removal Record includes, on page 638, Removal Total counts for

| Chart A | |
|---|---|
| 1200 | Normal Record-Running Total for Channel A |
| 1415 | Removal Record-Running Total for Channel B, Removal Total for Channel A, Removal Total for Channel B |
| 1421 | Insert New Module |
| 1600 | Insertion Record-Running Total for Channel A, Insertion Total for Channel A, Insertion Total for Channel B |
| 2000 | Normal Record-Running Total for Channel B |
| 0000 | Normal Record-Running Total for Channel A |
| 0400 | Normal Record-Running Total for Channel B |
| 0430 | Removal Record-Running Total for Channel A, Removal Totals for both Channels A and B |

Channel A and for Channel B, each comprising three full bytes. In addition, the Removal Record includes a Running Total for Channel B (since the Running Totals are alternated for the two channels). The Running Totals comprise two and one-half bytes—in other words, the lower order twenty bits of the Removal Total (which is three full bytes or twenty-four bits). In other words, in this case, the Running Total for Channel B will correspond to the lower order twenty bits of the Channel B removal Total count.

When the new memory module is inserted, at 1421 in the example, the microprocessor prepares an Insertion Record (Table I) in RAM; and this Insertion Record is transferred to the memory module at the end of the collection period during which the new memory module was inserted—namely, at 1600 hours. At this time, the Insertion Record includes a Running Total for Channel A (twenty bits) as well as Insertion Totals (twenty-four bits) for both Channels A and B. The Insertion Totals on the Insertion Record will be identical to the Removal Totals stored on the first module, but the Running Total for Channel A will include any measured event data occurring between removal of the first module (at time 1415) and the end of the collection period (time 1600).

At the end of each subsequent collection period, Normal Records are stored with Running Totals for alternate channels. Assuming that this memory module is removed at 0415 hours, a Running Total (twenty bits) would be part of the Removal Record for that partial period; and Removal Totals would also be stored for both Channel A and Channel B.

By thus storing both Removal Totals and Insertion Totals, as well as Running Totals, complete data continuity can be maintained for the records, and if an error does occur, it can be isolated to a give demand period, so as to minimize the loss of data.

Referring now to FIGS. 1 and 5, the recorder includes a five digit LED type display 37 for displaying various information provided by the microprocessor. The display data is coupled from the CPU 16 via I/O device 34 and the data bus 51.

There are two push button switches designated 39 and 40 in FIGS. 1 and 5 which are used to select the data that is to be displayed on the display 37 as well as to set the I.D., time and calendar data. It is considered an important advantage that this data can be set by maintenance personnel on site. For example, if it appears that the recorder is inoperative or faulty, the system can be built such that either a complete new unit or individual circuit boards may be replaced. He would then set the identification number of the old recorder, as well as time and calendar information, without having to return to the factory. This not only saves a maintenance trip, but it reduces the loss of billing data.

Normally the system displays the hour and minutes. If the operator wants to set data he first sequentially presses switch 40 (or simply leaves it depressed) in which case the items to be set will be sequenced in the same order, but by the internal clock of the system. Referring to Table IV, the first time that switch 40 is depressed, the five-digit I.D. number will be displayed, and the first digit (the most significant digit or digit 5) will be flashed. If the display is left in this state, subsequent depressions of switch 30 (will sequence that digit to the ten possible states (decimal digit 0-9).

If, before setting that digit, the operator had continued depressions of switch 40, the system would cycle through the parameters shown in the middle column of Table IV. For example, on the eighth depression of switch 40, the month and date would not be displayed, the month would be flashed on the display, and subsequent depressions of switch 39 would sequence the month (1-12). Ultimately, with sequential depressions of switch 40, the system reverts to program control in which the hour and minute are displayed.

If switch 39 is depressed first, the system goes into a Command Display Mode. In this mode, sequential depressions of the switch 39 causes the display of the following information in the order listed: (I) word 1: I.D.; (II) word 2: year/day of week; (II) word 3: month/day; (IV) word 4; hours/minutes; and (V) word 5: "PULSES" (which represents the Field Test Function). If switch 39 is held down in the Command Display Mode, the system will cycle through these words in the above order display time long enough to perceive the Field Test Function on the five-digit display 37.

To implement a field test function, the operator simply pushes switch 39 first. The controller, which normally displays hours and minutes, immediately displays the information the CPU has received from the I/O circuits 19 on data bus 51 and stored in a register. Channel A is displayed in one digit location (the furthest one on the left, for example), Channel B on another, and so on, if more channels are employed. As the state of the associated pulse initiator changes responsive to the consumption of energy, the signal being displayed alternates between a "I" and a "O" to indicate operativeness to the operator.

In its cyclic operation of the program, the CPU looks at the contents of the register and if they have changed from the data previously stored in RAM memory, thereby indicating a change of state in the associated pulse initiator, then a display subroutine is entered which changes the digit being displayed in the display location associated with that particular channel. It is an important function of this type of test that not only is the pulse initiator working, but also the data input channel electronics and microprocessor and RAM storage, etc., are also functioning properly, as well as the display logic and display.

To describe the Read-After-Write test in more detail, after a complete record is written in the bubble memory, the data is read out in a first-in first-out (FIFO) register in the memory controller. The data in the FIFO register is then transferred a byte at a time to the D register in the microprocessor which then compares the contents of the D register with the data that had been written to the bubble memory. Any detection of non-equality indicates a failure of the test. This procedure is repeated three times. If the Read-After-Write test fails three successive times, bits B20 and B21 are set to 1's in RAM to indicate such failure, and this record is written into the bubble memory a fourth time for permanent storage. A visual indicator 48 of FIG. 5, which may be an LED, may be caused to flash to alert personnel.

TABLE IV

| Word Selected By Switch 40 | Parameters Displayed | Parameter Set By Switch 39 |
| --- | --- | --- |
| 1 | 5 Digit ID | Digit 5 |
| 2 | 5 Digit ID | Digit 4 |
| 3 | 5 Digit ID | Digit 3 |
| 4 | 5 Digit ID | Digit 2 |
| 5 | 5 Digit ID | Digit 1 |
| 6 | Year/Day of Week | Year |
| 7 | Year/Day of Week | Day of Week |
| 8 | Month/Date | Month |
| 9 | Month/Date | Date |
| 10 | Hours/Minutes | Hours |
| 11 | Hours/Minutes | Minutes |
| 12 | Reverts to program control and starts internal clock | |

As indicated above, the device 49A is operator-actuated and has two states indicating respectively whether the memory module is in operative relation with the recorder or not. When the operator actuates it to permit the memory module to be removed, it generates a signal for enabling the CPU 16 to write the special Removal Record (Table III) into a predetermined location of the bubble memory. This takes only about 100 Ms. Similarly, when the new module is inserted and the lever 49A is moved to the position shown in solid in FIG. 5, it generates a signal to cause the CPU to prepare the Insertion Record (Table I) in RAM. It is noted that this record is not written into the first four pages of the new memory until the end of the collection period during which the new module is inserted. Briefly, the device 49 operates switch contact 49E (FIG. 1) which triggers a sensing circuit 62 for generating a control signal which is transmitted to the CPU 16 via I/O circuits 34, which may be conventional peripheral interface adapter circuits.

The foregoing description of the magnetic bubble memory system 12 describes a two-channel billing recorder. For a single channel recorder, the bubble memory module provides data storage for 213 8-hour collection periods. The assignment of memory locations for a single channel recorder is similar to that illustrated in Tables I-III for a two channel recorder in that 12 bits (on and one-half bytes) are provided for each demand interval. Hence, the 48 bytes which contain event data provide storage for 32 demand intervals for a single channel input, rather than 16 demand intervals as in the two channel recorder. Also, those bytes assigned for storage of the Running Total for the second channel of a two-channel recorder contain the single channel Running Total in the case of a single channel recorder.

OPERATION

Referring to FIGS. 1 and 3, each billing period (comprising a plurality of collection periods) is commenced when an erased (zeroed) bubble memory module is inserted into the recorder. By way of example, let it be assumed that the erased module is inserted on December 18 at 8:35 A.M. Upon operation of the device 49 to latch the memory card 24 into place, the cam 49C engages contact 49E causing the sensing circuit 62 to generate a control signal which is transmitted to the CPU 16 via I/O circuit 34, causing it to prepare the Insertion Record in RAM. Specifically, it stores data representing the month, day, hour and minute in RAM 18 along with the identifier code word for subsequent transfer to the bubble memory. The CPU 16 causes zeros to be written into RAM 18 in storage locations allocated to demand intervals of the current collection period for the two intervals which have already transpired, namely, the two demand intervals from 8:00 A.M. to 8:30 A.M.

After the module insertion time has been stored in RAM 18, the CPU 16 accumulates data pulses for the rest of the current access interval. The CPU 16 via input/output interface 19, scans the output of the data channels A and B and maintains a running count of the number of event pulses received for each channel for the balance of the collection period. The running count is also maintained in the RAM 18.

At the end of each demand interval, as indicated by the digital clock of the microprocessor system 11, the CPU under control of instructions stored in ROM 17 selects different storage locations in the RAM 18 for storing data words representing respectively the total numbers of pulses received over channels A and B during each demand interval. Twelve bits are allocated for each channel for each demand interval. The CPU 16 also maintains a running total of the data pulses received over each data channel A and B in separate total count registers. These totals are continuously updated for each timing pulse derived from the line frequency, in the normal case (i.e., where there is no power outage).

At the end of the partial period following insertion of the new memory module, the CPU 16 transfers the data stored in RAM 18 to the bubble memory 23 to provide the Insertion Record in accordance with Table I. First, the CPU 16 generates a signal for enabling solid state switch 29 to apply DC power to the DC to DC converter 28 for energizing the memory system 12. The CPU 16 also generates an address for the bubble memory system 12 to address the first page of the bubble memory module 23.

The four data words representing the month, day, hour and minute of insertion are transferred as a page to a FIFO register in the memory controller 21. A write command is then issued by the CPU 16 to cause the data to be written into the bubble memory. The memory controller 21 responds to the control signals provided by the CPU 16 to enable the function timing generator 42 to generate the control signals for effecting the write operations for application to the function driver 43 and coil drivers 44. The identifier code word as well as all other data of page one of an Insertion Record is transferred to the memory controller at the same time. The read-after-write test described above is performed after each complete record is transferred to the bubble memory.

When the first page of Insertion Record has been written into the memory 23, the CPU 16 then effects the transfer to the memory 23 of the demand data for the current collection period. The CPU generates an address for the bubble memory system to access the second page of the bubble memory module 23 and causes data representing the month (December), the day (18), and the hour (12 o'clock), defining the end of the current demand interval, to be written into the first three bytes of page 2 as shown in Table V. The memory locations (bytes 4–9) allotted to event data from the time 8:00 until the end of the demand interval immediately preceding insertion are zero-filled—namely, the demand intervals beginning at 8:00 and 8:15 for each channel. The data for channel A for the first partial demand interval (8:30–8:45) is recorded in the tenth byte and the first four bits of the eleventh byte. The corresponding data for channel B is recorded in the last four bits of the eleventh byte and the eight bits of the twelfth byte. Event data for the demand intervals up to 9:15 A.M. are entered in the normal fields for that record on page 2 of the memory.

TABLE V

| INSERTION RECORD - Page 2 | | |
|---|---|---|
| Byte | Information | Data |
| 1 | Month | 12 |
| 2 | Day | 18 |
| 3 | Hour | 12 |
| 4 | 8:00–8:15 (B) | zero |
| 5 | 00(B)/00(A) | zero |
| 6 | 8:00–8:15 (A) | zero |
| 7 | 8:15–8:30 (B) | zero |
| 8 | 15(B)/15(A) | zero |
| 9 | 8:15–8:30 (A) | zero |
| 10 | 8:30–8:45 (B) | partial |
| 11 | 30(B)/30(A) | partial |
| 12 | 8:30–8:45 (A) | partial |
| 13 | 8:45–9:00 (B) | filled |

TABLE V-continued

| INSERTION RECORD - Page 2 | | |
|---|---|---|
| Byte | Information | Data |
| 14 | 45(B)/45(A) | filled |
| 15 | 8:45–9:00 (A) | filled |
| 16 | 9:00–9:15 (B) | filled |
| 17 | 00(B)/00(A) | filled |
| 18 | 9:00–9:15 (A) | filled |

The CPU 16 then addresses page 3 of the memory and causes the remainder of the data for successive demand intervals up through the demand interval beginning at 10:30 for both channels to be recorded. The first fifteen bytes of page 4 then record event data for demand intervals up through the demand interval beginning at 11:45 A.M. The running total count for the data for channel A is written as the first twenty bits of the last three bytes in page 4, as explained above.

After the partial data for the first collection period has been written into the bubble memory and verified by recall in the CPU, the CPU 16 disables the solid state switch 29 thereby de-energizing the bubble memory system 12 during the next four-hour collection period. Also, the insertion of the bubble memory is sensed by the CPU which generates a current to change the state of the bistable indicator 47 to indicate that the bubble memory now stores data.

When a new (i.e., erased) bubble memory is inserted in the recorder, the CPU decrements interval mechanically register which is originally set to represent a predetermined thermal time period representative of the worst-case time for the bubble memory to achieve its operating temperature. The writing of data into the bubble memory is inhibited until the end of the thermal recovery period. The thermal recovery period could be implemented mechanically, and would not even be required, of course, if the bubbles memory specifications permitted operation through the full range. If the thermal recovery period overlaps the access time (i.e., extends into the next collection period), the CPU transfers the Insertion Record to an unused section of RAM until the time-out signal is generated; and it then transfers the Insertion Record data for storage in the bubble memory, even though it is not at the normal access time.

During the next collection period, the data is accumulated in the RAM 18 and transferred to the bubble memory 23 as a Normal Record, as shown in Table II. It will be observed that for this collection period the running total count for channel B is recorded in the first twenty bits of the last three bytes of page 7 of the bubble memory. The remaining pages are filled with Normal Records in like manner such that a total of up to 213 four-hour collection periods are recorded, including the two partial intervals when the memory card is inserted and removed, are recorded. The total count register of each channel is updated at the occurrence of each timing pulse.

Should a power failure occur (that is, the loss of 60 Hz. line voltage) during a collection period, an oscillator 32 (which may be the internal oscillator of the CPU) is used to generate the time base. The frequency of the oscillator signal is counted down by a divider circuit 31 to supply a time reference for the CPU 16. The CPU determines the power outage by sensing for the 60 Hz. line signal. Briefly, the 60 Hz. line signal is shaped into a pulse, and the CPU enters a loop comprising an interval timer. If the internal timer times out before the line frequency pulse is detected, the CPU defines it as a power outage and switches to crystal clock of oscillator 32 divided by divider circuit 31. This signal has a repetition rate of approximately 61 Hz. The DC power maintains the controller circuits energized during the power outage preventing loss of stored data and allowing the CPU to continue generating its time reference. However, the displays are disabled to conserve battery power.

When it is time to remove the memory card 24 at the end of the billing period, the device 49 is actuated by the exchange personnel and the CPU effects the recording of the Removal Record in accordance with the format set forth in Table III. If the memory module is removed before the end of an access period, the partial record, which is recorded in the last four pages of the bubble memory includes all of the data recorded in RAM during the access period. The CPU 16 also energizes an indicator 35 to indicate that a data transfer operation is in progress.

As illustrated in Table III, the month, day and hour of module removal are recorded in the first three bytes of page 638. The data in the partial demand interval is transferred to RAM. Whenever event data is written in the bubble memory and has been verified, whether at the end of a normal collection period or at the end of a billing period when the memory is being replaced, the intervals counters are reset to zero. The total counters remain updated at all times, and they roll over at a predetermined cumulative count. However, upon the first application of power, whether as a result of a power outage or recorder installation or replacement, the total counters are initialized by setting the contents to zero. Then the event data for both channels is written into pages 639–641 of the memory, preceeded by the five digit identifier and the running total counts for channels A and B as illustrated in Table III.

The customer has an option as to whether or not to account for daylight saving time changes via the Select D.S.T. input 33B of FIG. 1. In this embodiment, a computation is made to define the last Sunday of the month during which a DST/ST change is implemented. If he selects this option, in the spring when the change is to be implemented, two functions are performed: (1) the clock is incremented by one hour at 2:00 A.M. on the Sunday in which daylight saving time is implemented; and (2) the four demand intervals for each channel (assuming a 15 minute demand interval) associated with the hour 2:00 A.M. to 3:00 A.M. of that day have to be zero-filled. This is accomplished, briefly, by loading zeros into the associated demand interval portions of RAM and then writing that information into the bubble memory. Thus, the bubble memory is zero-filled for the demand intervals between 2:00 A.M. and 3:00 A.M. The event data is collected for the daylight saving time hour 3:00 A.M. to 4:00 A.M., and this data is written into the bubble memory in association with the proper demand intervals at the end of the next collection period.

In the fall, the clock is turned back an hour in switching from daylight saving time to standard time. Two separate records are prepared. In the first record, the four demand intervals for the hour between 12:00 and 1:00 as well as the four intervals for the hour between 1:00 A.M. and 2:00 A.M. have normal event data. The remaining two hours for that collection period are zero-filled to comprise record R1. This is written into the bubble memory at or shortly after 2:00 A.M. At the same time, the second record, namely record R2, is prepared by zero-filling the first four demand intervals comprising the hour 12:00 to 1:00, and thereafter, normal data is collected and stored. This record is written into the bubble memory at 4:00 A.M., the end of the current collection period.

Remote Interrogation

In the foregoing description, the recorded bubble memory modules are exchanged for an erased module at the end of each billing period, and the recorded modules are transported to a translating center for reading.

In FIG. 4 there is illustrated a block diagram of a system which permits remote readout of the recorded data over a communication link 70, such as a telephone link, established between the translating center 71 and the point of service 72 where the billing recorder is located.

An interrogate controller 73 at the translating center generates audio frequency interrogate signals which are transmitted over the link and coupled via line coupler 74 to a data transponder 75 associated with the billing recorder. The data transponder receiver 81 detects the audio frequency interrogate signals and generates suitable logic level control signals for application to the billing recorder circuits to effect readout of the recorded data. The input transponder includes a transmitter 82 which converts the logic level data signals read out into audio frequency signals, coded to represent the data, for transmission to the translating center.

A conventional telephone set 78 at the translating center is used to place a call to the number assigned to the telephone line coupler 74 causing the data transponder 75 to be coupled to a telephone line 79 which forms part of the telephone link. When the link is established, a read signal at a preselected audio frequency f0 is transmitted from the translating center to the data transponder and detected by audio frequency receiver 81 which includes a line detector which converts the received 1 audio signal to a logic level read command signal. The command signal is extended to the billing recorder controller by way of I/O circuit 34 (FIG. 2), for example.

The CPU 16 responds to the read command to effect sequential readout of the data stored in the bubble memory 23. The data read out is extended via the I/O circuit 34 to the transmitter 82, which responds to the logic 1 and logic 0 level data signals to generate audio frequency reply signals at different audio frequencies f1 and f2 respectively, for transmission to the translating center, the frequency coded audio signals are converted to a data format suitable for processing and transferred to a suitable storage medium.

BRIEF DESCRIPTION OF FLOW CHARTS

Referring to FIGS. 7–10, which show the flow charts, Charts I and II describe the overall system operation. Chart III takes the data including the index and event data recorded in RAM during Power Fail Mode II to establish the necessary format for recording that data in the bubble memory. Chart IV describes the operation of the program during Power Failure Recovery mode II for storing index numbers identifying associated demand intervals and the event data in RAM. The connectors shown on Charts III and IV reference back to the main flow chart—namely, Charts I and II as applicable.

Overall System Flow Chart

It will be observed that each of the blocks of the flow charts I-IV has numerals next to it. These indicate the lines or instructions of the program to which that portion of the flow chart corresponds.

Turning then to flow chart I, terminator block 101 indicates that on initial system power up the program proceeds to address 0 which then branches to process block 102 which is a cold start subroutine, proceeding to block 103, in which the registers (demand and total) and Random Access Memory are initialized. After the registers are initialized, the program proceeds as indicated in process block 104 to maintain the system in its present state (i.e., no data transfers to bubble memory) until a service operator removes the bubble memory, sets the clock, ID and time of the system, and then inserts a new bubble memory.

In process block 105, two RAM pointer registers and a constant zero register are reset. In decision block 106, the system determines whether the Magnetic Bubble Memory is being removed (this is done by sensing whether the contacts 49E, 49C have changed state). If it is removed, the program proceeds via process block 107 to set the "MBM removed" flag and to clear a fatal error flag, and it then proceeds to a junction point above a block labeled 115, to be described.

If the bubble memory is determined to be in place in block 106, the program proceeds to decision block 108 where it is determined whether a "removed" flag has been set. If it has not, the program proceeds to the junction point above block 115. If the "removed" flag has been set, the program proceeds to decision block 109 to determine whether the removal had been a normal removal, and if so, the program proceeds to block 113 where it compiles the data for the insertion or removal page comprising a portion of the previously described Insertion Record or Removal Record. A "normal" removal is defined as one in which the set mode is not entered—indicating that the operator did not have to set any of the clock or calendar or ID parameters.

If in block 109 the system determined that removal had not been under normal circumstances, the event data counter for demand intervals is cleared in block 110. Next, the program determines in decision block 111 whether the memory is being inserted or removed. If in block 111 the program had determined that it is an Insertion Record, then it proceeds to process block 112 which clears the byte RAM area designated RAM I which is the normal portion of RAM in which the event data is accumulated according to demand interval. For purposes of explanation, the data of RAM I is transferred to RAM II, a corresponding 48-byte portion of Random Access Memory used for storage of the event data while it is associated with the necessary data that accompanies a Normal Record (which also is included in the Removal and Insertion Records. A separate 18-byte portion of RAM is reserved for compiling the additional necessary data for Insertion Records and Removal Records.

Proceeding from block 113 to block 114, the program initializes the parameters associated with the newly inserted bubble memory. In block 115, output signals are generated for controlling all of the external devices associated with the system such as indicators, the demand interval termination indicator, etc.

Following the generation of output signals, exclusive of transferring data to the bubble memory, the program proceeds to decision block 116 in which it is determined whether Power Fail Mode I (PFI) is entered. Referring to FIG. 6, Power Fail Mode I is defined as commencing with the determination by the CPU that a power outage has occurred, see arrow 81. Power Fail Mode I extends to the end of the current collection period in which the power outage occurred (see 82). The program proceeds to process block 117 in which the power outage parameters are set up both for Power Fail I and II, sometimes referred to as PF1 and PF2 for short.

If, in block 116, it has been determined that PFI had not been entered, the program decrements the PFI timeout counter in block 118 and in 119 the system determines whether the 60 Hz. line signal is present. This is determined in a program loop timed by the main crystal oscillator of the CPU. If the 60 Hz. clock is not present within the time allotted (i.e. the counter of block 118 is decremented to zero), it is taken as an indication that power has been lost. Thus, once a power outage has been detected, the program proceeds to block 117, described above. After the power fail mode parameters have been set in block 117, the program proceeds to process block 120 and waits for the power outage clock (namely, the crystal oscillator 32 and divider 31) and continues to check for return of power by continuing to look for the 60 Hz. timing signal from the external source.

When either timing signal is detected, the program jumps via connector No. 4 to block 122. Returning back to decision block 119, if it is determined that the normal 60 Hz external clock is not overdue (i.e. it is detected before the counter of block 118 is decremented to zero), the program proceeds to decision block 121 in which it is determined whether the actual clock signal has been detected. If not, the program loops back to the junction point prior to block 115 via connector No. 3.

If the external clock is detected to have occurred in block 121, the program proceeds to block 122. When the clock does arrive, data counts accumulated in a register are transferred to RAM.

Next, in block 123, it is determined whether the system is being operated in a SET MODE, and if it is, the program proceeds via connector No. 6. to instruction number 246 of the clock-calendar subroutine represented by process block 125 on Chart II, to be described.

If, in decision block 123, it has been determined that the system is not being operated in SET mode, then the program proceeds to clear a Set Mode flag in block 124, and proceeds via connector No. 5 to block 125 of Chart II. The clock-calendar routine updates the clock and calendar information and keeps it current. The reason that there is a branch from the decision block 123 into the clock-calendar routine is in the case where an operator may be setting the date of a month, the program will not enable him to enter a non-existent date.

Next, in block 126, the system checks to see whether it is operating in daylight saving time as well as whether it is time to implement a switch to or from daylight saving time, and implements the appropriate function. Next, in decision block 127, the system determines whether it has arrived at the end of a demand interval, and if so it proceeds to block 128 to initialize certain RAM pointers.

The program then proceeds to block 129 in which it is determined whether the system is operating in Power Fail Mode II. If it is, the system proceeds to block 130 and saves the non-zero data in PFII format as will be described more fully below. Next, the system determines whether the thermal recovery period has terminated, and if so, it proceeds to the junction above block 142 via connector No. 7. If the thermal recovery period has not terminated, the program loops back to block 105.

If in block 129 the system has determined that Power Fail Mode II has not been entered, in block 132, it saves the event data in normal format, and proceeds to decision block 133 to determine whether it is the end of a collection period. If it is not the end of a collection period, the program proceeds to decision block 144, to be described.

Returning back to block 127, if the program had determined that it was not the end of a demand period, the program proceeds to decision block 134 to determine whether a complete data record has been recovered sufficient to transfer to the bubble memory. If it is not complete, the program proceeds to a power fail recovery routine as indicated in block 135 and described further in connection with Chart III.

If, in block 134, the system had determined that complete data had been accumulated or compiled for PF II recovery, the system proceeds to block 136 to determine whether it is in Power Fail Mode I, and if so, it jumps via connector No. 2 to block 105 of Chart I. If in block 136 it is determined that the system is not in Power Fail Mode I, it proceeds to a subroutine in block 137 to compile the output data for display on the five-segment digital display 37 of FIGS. 1 and 5.

Entry of the system into PF II mode occurs whenever the system is ready to write into the bubble module but is unable to do so. It would not be able to do so if the power was off, in which case a temperature bad flag would be set, or while in a thermal recovery period, where the temperature bad flag would still be set.

Referring to Chart II, in block 133 the processor has determined that the end of a collection period has been reached, meaning that the system is now ready to write to the bubble module. In block 138, the processor moves the data, calendar information, and a channel total to RAM II in anticipation of writing to the bubble module. A removal page is also assembled for transferral if the module is about to be removed in blocks 139 and 140. In block 141, the temperature bad flag is checked and if it is determined that the temperature prohibits the writing of the information to the bubble the system will enter PF II mode.

Returning to block 133, if it had been determined that it is the end of a collection period, the program proceeds to process block 138 in which a record is compiled for transferring the event data and associated data for one of the records to the bubble memory. In particular, the event data which had been accumulated in RAM I is transferred to RAM II where it is associated with the necessary time, date and total data for storage in the bubble memory. Next, in decision block 139, the system determines whether the bubble memory is being removed, and if it is, the system compiles data for the last page of a Removal Record in block 140. The system then proceeds to block 141. It would have proceeded directly to block 141 if it had been determined in block 139 that the bubble memory is not being removed. In block 141, a determination is made as to whether a thermal recovery period has ended; and if it has, in block 142, a subroutine is entered for transferring data from RAM to the bubble memory, whether it is a Normal Record, an Insertion Record, or a Removal Record. If in block 141 it had been determined that a thermal recovery period is still present, the program proceeds to block 143 where it enters Power Fail Mode II, and jumps via connector No. 2 to block 105 of Chart I.

Returning to block 144, a determination is made as to whether the system has changed from daylight saving time to standard time, and if it has, the DST-STD time change flag is cleared in block 145. If the change is determined not to have been made in block 144, a determination is made in block 146 whether the system is operating in a "Cold Start" mode, and if it is, it proceeds via connector No. 1 to block 104 of Chart I.

A cold start will be entered only under three circumstances. The first one will be the initial application of power upon system installation. Another time a cold start could be entered is immediately following re-application of power after a prolonged power outage with the battery fully discharged. A cold start requires operator intervention to set the clock and ID, and to remove the old bubble module from the recorder before it will again begin normal operation.

If in block 146 it had been determined that a "Cold Start" mode is not being implemented, the system proceeds to block 147 to determine whether the system is in a thermal recovery period; and if it is, the program jumps via connector No. 2 to block 105 of Chart I. If the bubble memory is operating within temperature specifications, the system determines whether the bubble memory power is on in block 148, and if it is, it jumps via connector No. 8 to block 141 on Chart II.

If the bubble memory power is not on as determined in block 148, the system determines in block 149 whether the bubble memory is inserted, and if so, it jumps by a connector No. 2 to block 105 of Chart I. If the bubble memory is not inserted, the system implements a routine in block 150 for initializing removal parameters, and jumps via connector No. 9 to block 128 of Chart II.

Referring now to Chart IV, which formats the data for storage in Power Fail Mode II, this chart is a more detailed flow chart of block 130 of Chart II described above.

This subroutine commences in terminator 154 and proceeds to process block 155 for initializing address registers and pointers. In block 156 the program determines whether there is any portion of RAM I left to store additional data, and if there is not, it proceeds to block 157, it enters zeros in the register holding the event data for the current demand interval, and jumps via connector No. A3 to block 159. If there is additional storage room in RAM I as determined in block 156, the program proceeds to block 158 where it is determined whether any event data has been detected for the current demand interval, and if it has not been detected, the program proceeds to block 159 to determine whether a thermal recovery period is being implemented. If it is, the program proceeds via connector No. 2 to block 105 of Chart I, and if the operating temperature of the bubble memory is within specifications, the program jumps via connector No. 7 to block 142 of Chart II.

If in block 158 the program determines that there is current event data, then it proceeds to block 160, a register pointer is set as will be described. Next, in block 161, the address associated with the location for storing the data is loaded into the address register. This is the next sequentially occurring address available for storage in RAM I. Next, in block 162, an index number associated with the address defined in block 161 is stored. This index number, as indicated above, is representative of the demand period following the entry into Power Fail Mode II. In block 163, the demand interval event data is stored in RAM, and in block 164, the incremented address for storing data is saved, and the program proceeds to block 157 to reset the demand interval register for the next demand interval.

To summarize operation of the system in Power Recovery Mode II, the CPU determines whether there is non-zero data associated with a current demand interval. If the data is all zeros, it is taken as an indication that power is still out, and no data is stored, but the contents of the index register are incremented at the end of that demand interval. Thus, the contents of the index register are representative of the number of a demand interval following the time at which the system entered the Power Failure Mode II. Two bytes (16 bits) identify an index number and two bytes are used for recording non-zero event data for each demand interval per channel. If it is determined that the data associated with a given demand interval during PF II is other than zero, then the data is stored as follows: the contents of the index register representative of the demand interval is stored in two bytes, and the event data is stored in two bytes. It will be appreciated that power may return for a time less than the thermal recovery period, in which case the event data is not lost, but preserved in RAM.

The time and calendar data is not reconstructed in going from the compacted storage format of PF II to a normal record. The time and calendar information can be reconstructed in the translation system based on the calendar and time data contained in the preceding and following records that are written before the power failure and after full recovery from the power failure. The time data for a reconstructed normal record is relative to the position of the data within the record as referenced to the preceding and following data.

After a power failure which causes the system to enter PF II mode, application of power will start a thermal recovery period. At the end of the first demand interval following the end of the thermal recovery period the processor will write the data contained in RAM II to the bubble module. When finished with the writing of that data the processor then determines if data is stored in PF II format. If it determines that data is in PF II format, it then sets a flag causing the software to proceed through the power failure recovery routine on successive passes through the program. Entry to the routine occurs at block 167 on Chart III. The program then proceeds to process block 168 which sets up register No. 4 as an additional RAM pointer. In block 169, register No. 1 is set up to point at the number of demand periods that have, to this point, been recovered form the PF II format in RAM I. This also includes the "all zero" demand intervals (i.e., no power consumption because power has not returned) that have not been recorded anywhere, but which have been accounted for by incrementing the PF II index number.

Proceeding to process block 170, the program loads, increments and saves the number of demand periods for which data has been recovered from the PF II format, and proceeds to block 171 in which pointer register No. 1 is set to the next available location in RAM II. Next, in decision block 172 it is determined whether the system is recovering a record and formatting it in RAM II. A complete record would be for a full collection period.

If it is recovering a record, the program proceeds to process block 175. If it is not in the process of recovering a record as determined in block 172, the program proceeds to process block 173 to fill with zeros all locations of RAM II except the last three bytes. The reason for this is that as the locations are filled with event data and eventually the record becomes complete, which may be a partial record, the remaining demand intervals are filled with zeros prior to transfer to the bubble memory for storage, or back to RAM I. That is, if recovery occurs during the same collection period for which the data stored in RAM II is current, then the system transfers the data in RAM II back to RAM I and continues to record event data for that current collection period prior to transferring the data to the bubble memory.

Next, the program proceeds in block 174 to point register 1 to the fourth byte of RAM II which is the starting point for storing event data to be transferred as a record to the bubble memory.

In block 175, the program points register 4 to an index number representative of a demand interval associated with data being recovered from RAM I and transferred to RAM II. This is used as a check, when comparing with the actual index numbers stored in RAM I as a validity check for the data being formatted in the RAM II.

Proceeding to process block 176, the program then points register 2 to the address value identifying, if such is the case, the index number associated with the demand interval at which a time change is being made from daylight saving time to standard time. If such a change occurs during Power Fail Mode II, and indication must be stored that the special records mentioned above have to be compiled before transfer of data to the bubble memory.

Proceeding then to block 177, a determination is made whether the period number being recovered (that is, the index number for which data is being recovered), equals the period number of the time change described in connection with block 176. If the two are the same, the reset index number identified in block 176 is set to 0, and in block 179, the index number being recovered is decremented by 4. So that room is left on the next record to be transferred to bubble memory to "zero fill" the first four demand intervals associated with the first hour prior to a switch back to standard time—i.e. 12:00 A.M. to 1:00 A.M.—as described above.

The program then proceeds to block 188 to update the indicator which establishes whether the total count for the current collection period being composed is associated with channel A or B so that when power returns, the two will not have been interchanged. Next, in block 189, the last three bytes associated with the total count in RAM II are zeroed, and the program proceeds to block 190 to clear the flag associated with incomplete record recovery as described above.

Returning now to block 177, if the time change identified in block 176 is not being effected, the program proceeds to block 180 to point register 2 at the start address of RAM I which, it will be recalled, is an index number associated with the first demand interval following the entry of PF II mode.

Next, in block 181, it is determined whether the index number thus recovered is equal to the index number for which present data is being recovered. If it is not, the program proceeds via process block 182 to store zeros in RAM II for the associated demand interval. If the index number is the same as the period for which data is being recovered, the program proceeds in block 183, it resets the next storage location in RAM I to the location next available for storage. The program then proceeds via block 184 to store the event data recovered from RAM I to RAM II in the normal format. That is, the system is composing the record for storage in bubble memory and transferring it to RAM II. Next, the program proceeds to shift the data in the remainder of RAM I which has not yet been recovered and shifted to RAM II to fill the available storage vacated by virtue of the data recovered from RAM I and stored in RAM II. This facilitates having the index number always in the start location and frees up some of RAM I for additional storage should the system encounter another power outage.

Next, in process block 186, the system zero-fills the unused portion of RAM I, and proceeds to decision block 187 to determine whether RAM II is filled. If RAM II is filled, the system proceeds to block 188 described above, and if RAM II is not filled, the system proceeds to block 191 in which it is determined whether the recovery period is beyond the current real time period. If it is, the program loops to block 194; however, if it is not, the program proceeds in block 192 to determine whether the recovery period is the same as the current period; and if it is, it proceeds to block 194. If the recovery period is not the same as the current period, the program sets an incomplete record recovered flag in block 193, as described above, and jumps via connector No. 2 to block 105 of Chart I.

In block 194, the program sets the recovered period index number to 0, and proceeds to block 195 to move from RAM II to RAM I in an effort to re-initiate normal system operation. Next, in block 196, the program clears the flag for Power Fail Mode II as well as the flag for incomplete record recovery and proceeds to block 197 to branch to the bubble controller subroutine to turn the bubble memory off, and then jumps via connector No. 2 to block 105 of the main program.

USER OPTIONS

There are three user options in the system, and they are diagrammatically represented in FIG. 1 by blocks designated respectively 33A, 33B and 33C. These represent selections of: (a) one or two input channels; (b) Daylight Saving or Standard Time Select; and (c) Fifty or Sixty Hz. line frequency. Each of these selectors may comprise a wired logic state, a toggle switch, or a binary circuit.

According to the first option, namely Channel Select, the user has the option of determining whether one or two input channels are stored in the bubble memory. The output signal, referred to as EF2 is sensed by the CPU 16 and used as appropriate throughout the data processing. For example, in Chart B, block 132, the CPU has to determine whether there are one or two input channels for storing demand interval data in the appropriate RAM locations, as described in detail elsewhere. Similarly, the DST/ST Select generates a logic signal EF3 which is used by the CPU 16 in block 126 of FIG. 2 to effect changes as they occur and as selected by the user. Finally, block 33C generates a signal as selected by the user and designated EF4 which accommodated the system to either fifty or sixty Hz. line frequency; and this information is used in block 125 of Chart B to generate clock and calendar data. Briefly, this data is generated by incrementing a register to a predetermined count (namely, to sixty in the case of 60

Hz. line frequency or to fifty in the case of 50 Hz. line frequency) for incrementing a register which counts seconds and determines the program execution time.

TOTALIZER OPERATION

Referring to FIG. 1, there are four input channels designated respectively A, B, C, and D. Each of these channels is associated with a conventional pulse initiator for receiving input data; and each of the input channels, designated respectively 19A, 19B, 19C and 19D comprises a latch circuit responsive to incoming data from an associated pulse initiator for storing it temporarily. The output signals of the data channels are fed in parallel to the input/output circuits 19 of the microprocessor which also are latching circuits.

Data channels C and D are shown in chain line because, as indicated above, the system may be a single channel or a two channel recorder. In the case where channels C and D are used, the system may be a totalizer—that is, the event data from two input channels is accumulated and stored. Where data channels C and D are present, and it is desired to sum or "totalize" the inputs, for example, the inputs on channel A can be totalized with those on channel C, and those on channel B can be totalized with the data inputs on channel D. In this case, the microprocessor reads the data on channel A, and the data on channel C and adds either zero, one or two counts to the appropriate Running Total count for the current demand period and separately, the cumulative counts for Insertion and Removal Totals, as described above. This updating of the registers happens every input data sample period which, in the illustrated embodiment, is derived from line frequency.

Because of the high speed at which the microprocessor is capable of sampling input data relative to the time periods during which input data is expected to change, this capability of totalizing is inherent in the system. That is, the problems associated with coincidence of data inputs in conventional totalizers are inherently overcome due to the structure of the system.

The accompanying lists L1 and L2 (FIGS. 11-12) comprise a list of instructions or code for implementing the operations described above for an RCA microprocessor identified as the CDP1802 COSMAC Microprocessor. The left hand column is a list of the starting addresses for the first instruction. The code is in hexadecimal notation, so each line includes sixteen instruction codes in the order in which they appear in the program. The code is identified in a document entitled "Instruction Summary for the CDP1802 COSMAC Microprocessor" published by RCA, Inc.

Having thus disclosed in detail preferred embodiments of the invention, persons skilled in the art will be able to modify certain of the structure which has been disclosed and to substitute equivalent elements for those which have been illustrated. For example, the length of demand interval and collection period may be changed. The device 48 may merely sense the insertion and removal of the module. The number of channels, data storage allocations and event data representations (totalized, for example) may also be varied, among other things. It is, therefore, intended that all such modifications and substitutions be covered as they are embraced within the spirit and scope of the appended claims.

We claim:

1. Data recording apparatus for providing a record of event measurement data from at least one data source comprising:

input means for receiving data signals representing said event measurement data;

timing means for generating time reference signals representative of real time;

controller means for receiving said data signals from said input means and being responsive to said time reference signals for generating real time data signals defining time intervals and for generating data word signals representative of the quantity of data signals received during each time interval;

first memory means having a plurality of storage locations for storing said real time data signals and said data word signals associated with said intervals for each of a number of said intervals which comprise a collection period; and second memory means comprising non-volatile, solid state memory means, which retains stored data in the absence of power to said second memory means and memory control circuit means responsive to said controller means for transferring said real time data signals and said data word signals accumulated in said first memory means to said non-volatile memory means at the end of a collection period for storing the same in predetermined relation.

2. The apparatus of claim 1 further comprising switchable power source means for said solid state memory means, said controller means being responsive to said timing means for selectively energizing said power means during access times for said solid state memory means for writing said data word signals and said real time data signals therein.

3. The apparatus of claim 2 wherein said timing means derives said time reference signals from a line frequency signal, said controller means sensing the absence of said line frequency signal for controlling said switchable power source means for de-energizing said solid state memory means during power outages.

4. The apparatus of claim 3 wherein said first memory means includes further storage locations for storing event data during power outages while transfer of data to said solid state memory means is inhibited.

5. The apparatus of claim 1 wherein said data source generates serial data and said recording apparatus is a recorder unit associated with said data source and includes receptacle means, said second memory means comprising a removable memory module including said solid state memory means and adapted to be removably received in said receptacle means for operative association with said memory control circuit means.

6. The apparatus of claim 5 further comprising actuatable means actuatable to generate a first state signal representative of said memory module's being inserted in said receptacle means and a second state signal representative of said memory module's being prepared for removal from said receptacle means, said controller being responsive to said first state signal for preparing Insertion Record data and for storing the same in said solid state memory means after insertion of said memory module in said receptacle means, said controller means being further responsive to said second state signal for preparing Removal Record data and for storing the same in said solid state memory prior to removal of said memory module from said receptacle.

7. The apparatus of claim 1 wherein said data source is an electric meter and said signals from said data source comprise pulses, each representative of a predetermined quantity associated therewith, and wherein said controller means generates a total count data word representing a continuous running total count for said pulses for all of said intervals and stores said total count data word in said solid state memory means.

8. The apparatus of claim 1 wherein said second memory means is adapted to store said data words for a plurality of collection periods, and including preassigned memory locations for separately recording data words associated with said measured events occurring within collection periods associated with said locations respectively, said controller means generating a further data word representing a running total count for detected events during successive collection periods and storing said total count data word in said solid state memory means at the end of each collection period.

9. The apparatus of claim 1 wherein said input means includes means for receiving data signals from a plurality of data sources, said controller means processing the data signals received from each data source and generating separate data words representative of the number of data signals received from each data source during the same time interval.

10. The apparatus of claim 1 wherein said solid state memory means is removable from said data recording apparatus and replaceable by another solid state memory means, and wherein said controller means stores identification data signals representative of the particular data recording apparatus with which said controller means is associated, said controller means further transferring said identification data signals for storage in said solid state memory means.

11. The apparatus of claim 10 further comprising externally accessible set means actuatable by an operator for selectively setting said identification signals stored by said controller means, whereby the identification of said recording apparatus may be changed on site.

12. The apparatus of claim 11 wherein said controller means is responsive to said timing means for generating signals representative of calendar data words, and for storing calendar data words in said solid state memory means in predetermined relation with data words associated with intervals defined by said stored calendar data words.

13. The apparatus of claim 1 wherein said solid state memory means comprises a magnetic bubble memory for storing event data words serially, said memory characterized in that the signals stored therein are retained in the absence of power supplied to said memory, said controller energizing said memory means only when accessing the same for storing data therein.

14. The apparatus of claim 13 wherein said nonvolatile memory means further comprises bistable visual indicator means for providing a first indication whenever the magnetic bubble memory is erased, and for providing a second indication, distinguishable from said first indication, whenever data is stored in the magnetic bubble memory.

15. The apparatus of claim 4 wherein said data recording apparatus includes a receptacle for removably receiving said memory module, said data recording apparatus further including means actuatable by an operator and having control signal generating means responsive to operation of said actuatable means for generating first and second control signals in response to operation of said actuatable means after insertion and before removal of said memory module, respectively; and said controller means being responsive to said control signals for generating associated records in said first memory means and transferring the same to said second memory means.

16. The apparatus of claim 15 wherein said controller means is responsive to said first control signal upon insertion of a memory module for generating time reference data indicating the time of insertion, and storing said time reference data in said first memory means for subsequent transfer to said second memory means.

17. The apparatus of claim 15 wherein said controller means is further responsive to said first control signal for storing in said second memory means signals representative of the identification of said recording apparatus.

18. The apparatus of claim 17 wherein said controller means is further responsive to said first control signal for storing Removal Total data in said second memory means representative of total counts of measured events up to the time of removal of said first memory.

19. The apparatus of claim 15 wherein said controller means is responsive to said second control signal prior to removal of a memory module for generating time reference data indicating the time of removal of said second memory means, and storing said time reference data in said second memory means prior to removal of the memory module.

20. The apparatus of claim 19 wherein said controller means is further responsive to said second control signal for storing identification data in said second memory means representative of said particular data recording apparatus prior to removal of said second memory means therefrom.

21. The apparatus of claim 20 wherein said controller means is further responsive to said second control signal for storing Removal Total data in said second memory means representative of a cumulative running total of said measured events prior to removal of said second memory means.

22. The apparatus of claim 15 wherein said control signal generating means of said actuatable means comprises a switch having contacts operable between open and closed positions in response to operation of said actuable means, and sensing circuit means responsive to operation of said switch contacts to generate said control signals.

23. The apparatus of claim 1 wherein said controller means is responsive to said timing means for generating signals representative of calendar data and wherein said controller means is responsive to data stored in said first memory means representative of changes to and from daylight saving time, for generating special records for storage in said solid state memory means when said changes are effected.

24. The apparatus of claim 1 wherein said controller means generates a data word representative of the quantity of data signals received during a predetermined time interval for a predetermined number of such time intervals comprising a collection period, and stores the event data for a complete collection period in said first memory means prior to storage in said second memory means, said controller means generating a normal data record at the end of each collection period including calendar data identifying said collection period and event data words for each demand interval in said collection period and for transferring said normal data record to said solid state memory means at the end of each collection period.

25. The apparatus of claim 1 wherein said controller means performs a comparison test after each transfer of data from said first memory means to said second memory means by retaining the data in said first memory means, writing the same data into said second memory means, retrieving the data written into said second memory means and comparing said data with the corresponding data retained in said first memory means, said controller means further transferring test failure signals for storage in said second memory means if a failure of said read-after-write test is detected.

26. The apparatus of claim 1 further comprising display means and externally accessible control means, said controller means being responsive to said externally accessible control means for coupling the contents of said first memory means representative of said data word signals to said display means for displaying changes in said data word signal in real time, said changes being representative of the operability of said input means, said first memory means and said controller means.

27. The apparatus of claim 1 further comprising a data transponder associated with said data recording apparatus and including receiver means for receiving an interrogate signal generated by an interrogate means at a location remote from the location of said data recording apparatus and transmitted to the location of said data recording apparatus over a communication link, said receiver means being responsive to said interrogate signal to generate a control signal for application to said controller means for retrieving the data words stored in said second memory means, and said data transponder means including transmitter means responsive to the data words read out for generating information signals representing data words for transmission over said communication link to said interrogate means.

28. The apparatus of claim 27 wherein said communication link includes a telephone line, said interrogate means including means for establishing said communication link between said first and second locations and for connecting said data transponder to said telephone line.

29. Data recording apparatus for providing a record of event measurement data from a data source, comprising:
input means for receiving serial data signals representing said event measurement data from said source;
timing means for generating time reference signals representative of real time;
data processing means responsive to said time reference signals for generating real time data signals indicating collection periods and for accumulating said input data signals during sequential collection periods of predetermined time and generating data words representative of said signals received during said collection periods;
signal storage means including memory control circuit means and removable solid state memory means, said control circuit means being responsive to said data processing means for storing said data words and said real time data signals in said solid state memory means after each collection period in normal data records when a given collection period does not include the insertion or removal of said solid state memory means, and for storing partial records including an insertion data record following insertion of said solid state memory means into said apparatus, and a removal data record prior to removal of said solid state memory means from said apparatus.

30. The apparatus of claim 29 further comprising actuatable means actuatable by an operator for generating a first signal upon actuation prior to the removal of said solid state memory means and a second signal after the insertion of a solid state memory means into said apparatus, said data processing means being responsive to said second signal for generating an insertion data record for the collection period in which said second signal is generated and including in addition to a normal data record, data representative of the time of insertion of said solid state memory means and the identification of said data recording apparatus.

31. The apparatus of claim 30 wherein said data processing means is further responsive to said second signal of said actuatable means for storing as a part of said insertion data record a total running count of said event measurement data from said source.

32. The apparatus of claim 29 further comprising actuatable means actuatable by an operator for generating a first signal upon actuation prior to the removal of said solid state memory means and a second signal after the insertion of a solid state memory means into said apparatus, said data processing means being responsive to said first signal for generating a removal data record and for storing the same in said solid state memory means, said removal data record including a normal data record and data representative of the time of removal of said solid state memory means and data identifying said recording apparatus.

33. The apparatus of claim 32 wherein said removal data record further includes data representative of a cumulative running total of said event measurement data up to the time of removal.

34. Data recording apparatus for providing a record of event measurement data from a data soruce, comprising:
input means for receiving serial data signals representing said event measurement data from said source;
timing means for generating time reference signals representative of real time;
signal processing means responsive to said time reference signals for generating first timing signals representative of collection periods of a first duration;
said signal processing means further receiving said data signals from said input means and accumulating said data signals during each of said collection periods and generating data words representative of said signals received during said periods;
first signal storage means under control of said signal processing means for temporarily storing said data words and associated first timing signals during a collection period;
second signal storage means including solid state non-volatile memory means and memory control circuit means responsive to said signal processing means for transferring the data words and said first timing signals from said first signal storage means to said non-volatile memory means during access times after each collection period; and
said processing means de-energizing said second signal storage means between said access times, and said second signal storage means retaining the data words stored therein when said second signal storage means is deenergized.

35. Data recording apparatus for providing a record of event measurement data from a data source comprising:
- input means for receiving data signals from said source representing said event measurement data;
- controller means for receiving said data signals from said input means and for generating data words representative of the number of data signals received from said source during a given interval of tme;
- non-volatile solid state signal storage means for storing said data words;
- energizing means connected to a source of power for deriving power signals for selectively energizing said controller means and said signal storage means;
- said controller means including timing means for generating timing signals indicating writing intervals during which the data words processed by said controller means are stored in said signal storage means; and
- said energizing means including power switching means responsive to said controller means for energizing said signal storage means only during writing intervals, and in the absence of energizing signals, said non-volatile signal storage means retaining the data words stored therein.

36. Data recording apparatus for providing a record of event measurement data from a data source comprising:
- input means for receiving serial data signals representing said event measurement data from said source;
- timing means for providing time reference signals;
- signal processing means responsive to said time reference signals for generating first timing signals representative of collection periods of a first duration, second timing signals representative of demand intervals synchronized with said first timing signals, each collection period including a plurality of said demand intervals, and calendar data words for identifying each collection period;
- said signal processing means further receiving said data signals from said input means and accumulating said data signals during each of said demand intervals of each collection period and generating a plurality of demand interval data words each representative of the number of data signals received during an associated demand interval; and
- signal storage means including non-volatile solid state memory means, which retains stored data in the absence of power to said memory means and memory control circuit means responsive to said signal processing means for storing said calendar data words in a predetermined location in said memory means and storing said demand interval data words serially after each collection period, said apparatus characterized in that memory locations for said data words are associated with a known demand interval.

37. The apparatus of claim 36 wherein said signal processing means further generates a collection period data word representative of the total count for detected events during the collection period, and wherein said memory control circuit means is responsive to said signal processing means to store said collection period data word in a predetermined location in said memory means in association with said demand interval data words.

38. The apparatus of claim 37 which comprises random access signal storage means for storing the demand interval data words generated during each collection period, said signal processing means causing the data words stored in said random access signal storage means to be stored in said non-volatile memory means after each collection period.

39. The apparatus of claim 36 further characterized in that said input means includes first and second channels and that said memory locations of said solid state memory are further associated with a predetermined input channel.

40. Data recording apparatus for providing a record of event measurement data from a plurality of data sources, comprising:
- input means for receiving serial data signals representing said event measurement data from said data sources over separate data channels;
- timing means for providing time reference signals;
- signal processing means responsive to said time reference signals for generating first timing signals representative of collection periods of a first duration, and second timing signals representative of demand intervals synchronized with said first timing signals, each collection period including a plurality of said demand intervals, and calendar data words representative of times identifying each collection period;
- said signal processing means further receiving said data signals from said input means and accumulating said data signals during each of said demand intervals and generating demand interval data words representative of the number of data signals received over one of said data channels during an associated demand interval; and
- storage means including non-volatile solid state memory means, which retains stored data in the absence of power to said memory means and memory control circuit means responsive to said signal processing means for storing said calendar data words in a predetermined location in said memory means and for storing said demand interval data words in association with said calendar data words after each collection period.

41. The apparatus of claim 38 wherein said signal processing means further generates a collection period data word representative of the total count for detected events during the collection period, and wherein said memory control circuit means is responsive to said signal processing means to store said collection period data word in a predetermined location in said memory means in association with said demand interval data words.

42. In a data recorder for recording event measurement data signals from at least one data source, said data recorder having at least first and second input data channels, the improvement comprising controller means including a programmed data processor means for receiving said data signals over said first data channel and for generating data words representative of the quantity of data signals received in predetermined time intervals;
- solid state memory means;
- memory control circuit means for transferring said data word signals to said memory means for storing the same;

selection means for generating an external signal representative of a first option desired by a user whereby said data recorder is enabled to receive event measurement data signals from a further data source over said second data channel;

said data processor means being responsive to said external selection signal for implementing the selected user option under program control.

43. The apparatus of claim 42 wherein said selection means generates an external selection signal comprising a binary signal having a first state representative of a desired user option to record data from one input channel and a second state representative of a desired user option to record data from said first and second input channels; said data processor means being programmed to respond to said external selection signal for recording input data from one or both of said input channels depending upon the state of said external selection signal.

44. The apparatus of claim 43 further comprising timing means for generating digital signals representative of real time; said data processor means generating said data word signals representative of the quantity of data signals received during predetermined time intervals and storing the same in said memory means responsive to said real time signals and in predetermined relation thereto.

45. The apparatus of claim 44 wherein said data processor means includes controller circuit means under program control for storing data word signals representative of measured data from said two input channels in alternate word locations in said memory means for a common time interval as determined by said timing means.

46. The apparatus of claim 42 further comprising timing means for generating signals representative of real time, said data processor means being responsive to said real time signals for storing said data words in said memory means for predetermined demand intervals as defined by said real time signals, and wherein said data processor means generates calendar data words from said real time signals, said selection means generating a further external selection signal being representative of a desired user option to change said calendar data words to daylight saving time, said data processor means being responsive to said further external selection signal and stored information representative of a change to or from daylight saving time for incorporating such change into said calendar data generated thereby.

47. The apparatus of claim 42 further including timing means responsive to a line frequency signal for generating timing signals therefrom, said data processor means being responsive to said timing signals for executing programmed instructions based upon a predetermined count of said line frequency signal, and wherein said selection means generates a further external selection signal which represents a further user option for operating said apparatus on an external line frequency signal of fifty or sixty hertz, said data processor means being responsive to said further external selection signal to accommodate one of said external line frequencies in response thereto.

48. Data recording apparatus for providing a record of event measurement data from a data source, comprising:

input means for receiving serial data signals representing said event measurement data from said source;

timing means for generating time reference signals representative of real time;

data processing means receiving said data signals from said input means and being responsive to said time reference signals for accumulating said input data signals during sequential collection periods of predetermined time and generating event data words representative of the quantity of said data signals received during said collection periods, and calendar data words identifying each collection period; and signal storage means including memory control circuit means and a plurality of removable solid state memory means each adapted to be associated with said data processing means for storing said event and calendar data words for a plurality of collection periods comprising a billing period, said memory means adapted to be removed from said apparatus after a billing period for processing of said recorded data;

said data processing means storing said event and calendar data words in said solid state memory means after each collection period in Normal Data Records when a given collection period does not include the insertion or removal of said memory means, each Normal Data Record being associated with a known calendar time period and including recorded data representative of a running total count of measured events up to the end of the collection period with which the Normal Data Record is associated.

49. The apparatus of claim 48 wherein said data processing means further stores Removal Data Records in said signal storage means for a partial collection period during which a memory means is removed therefrom, each Removal Data Record including recorded data representative of a cumulative Removal Total count of measured events up to the end of the partial collection period during which a memory means is removed from said apparatus.

50. The apparatus of claim 49 wherein said data processing means further stores Insertion Data Records in said memory means for a partial collection period during which a new memory means is inserted in said apparatus and including a cumulative Insertion Total count representative of measured events up to the end of the partial collection period during which the previous memory means was removed from said apparatus, as well as recorded data representative of a Running Total count for measured events up to the end of the partial collection period during which the new memory means is inserted, thereby establishing continuity between records on different memory means.

51. The apparatus of claim 50 wherein said data processing means is further responsive to said timing means to store data in a Removal Data Record representative of the calendar time at which the associated memory means is removed from said apparatus.

52. The apparatus of claim 51 wherein said data processing means is further responsive to said timing means for storing in each of said Insertion Data Records, data representative of the calendar time at which the associated memory means was inserted in said apparatus.

53. The apparatus of claim 52 wherein said data processing means is further responsive to said time reference signals for storing calendar time data in each of said Normal Data Records defining each collection period comprising a Normal Data Record.

* * * * *

UNITED STATES PATENT AND TRADEMARK OFFICE
CERTIFICATE OF CORRECTION

PATENT NO. : 4,361,877
DATED : November 30, 1982
INVENTOR(S) : Robert E. Dyer and Murray C. Carney It is certified that error appears in the above—identified patent and that said Letters Patent is hereby corrected as shown below:

Column 31, line 37, change "ll" to ---1---;

Column 34, line 38, change "soruce" to ---source---; and

Column 35, line 10, change "tme" to ---time---.

Signed and Sealed this

Eighth Day of March 1983

[SEAL]

Attest:

GERALD J. MOSSINGHOFF

Attesting Officer

Commissioner of Patents and Trademarks